(12) United States Patent
Choi

(10) Patent No.: US 7,534,642 B2
(45) Date of Patent: May 19, 2009

(54) METHODS OF MANUFACTURING AN IMAGE DEVICE

(75) Inventor: Ja-Young Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 401 days.

(21) Appl. No.: 11/311,371

(22) Filed: Dec. 20, 2005

(65) Prior Publication Data

US 2006/0141653 A1 Jun. 29, 2006

(30) Foreign Application Priority Data

Dec. 23, 2004 (KR) .................. 10-2004-0110836

(51) Int. Cl.
*H01L 21/00* (2006.01)
(52) U.S. Cl. .................. 438/57; 438/69; 438/634; 257/E21.001
(58) Field of Classification Search .................. 438/57, 438/69, 634; 257/E21.001
See application file for complete search history.

(56) References Cited

U.S. PATENT DOCUMENTS 6,103,616 A * 8/2000 Yu et al. .................. 438/622

2004/0140564 A1* 7/2004 Lee et al. .................. 257/758
2006/0115230 A1* 6/2006 Komoguchi et al. ........ 385/146

FOREIGN PATENT DOCUMENTS

| JP | 10-321828 | 12/1998 |
| JP | 2003-282853 | 10/2003 |
| KR | 1020030044330 A | 6/2003 |
| KR | 1020040065963 | 7/2004 |

* cited by examiner

*Primary Examiner*—Alexander G Ghyka
*Assistant Examiner*—Angel Roman
(74) *Attorney, Agent, or Firm*—Volentine & Whitt, PLLC.

(57) ABSTRACT

In methods of manufacturing an image device, a first structure including a transparent lower portion and an opaque upper portion is formed on a substrate having a photodiode. An etch stop layer pattern positioned over the photodiode is formed on the first structure. A second structure having at least one opaque capping layer is formed on the first structure to cover the etch stop layer pattern. An opening partially exposing the lower portion of the first structure is formed over the photodiode by etching the second structure, the etch stop layer pattern and the opaque upper portion of the first structure.

36 Claims, 25 Drawing Sheets

METHODS OF MANUFACTURING AN IMAGE DEVICE

CROSS REFERENCE TO RELATED APPLICATION

This application claims benefit of priority under 35 USC § 119 from Korean Patent Application No. 2004-110836 filed on Dec. 23, 2004, the disclosure of which is incorporated herein by reference in its entirety for all purposes as if fully set forth herein.

BACKGROUND OF THE INVENTION

1. Field of the Invention

The present invention relates to methods of manufacturing an image device. More particularly, the present invention relates to methods of manufacturing a complementary metal-oxide semiconductor (CMOS) image sensor.

2. Description of the Related Art

An image sensor may convert optical information of two or more dimensions into an electrical signal. The image sensor may be classified as either an image pick-up tube or a solid-state imaging device. Image pick-up tubes are widely employed in television cameras. In addition, recent advancements in image processing technology of the image pick-up tube have been developed. Examples of the image processing technology include image measurement, image control and image recognition. The solid-state imaging device may be classified as a complementary metal-oxide semiconductor (CMOS) image sensor or a charge-coupled device (CCD).

The CMOS image sensor may convert an optical image into an electrical signal by using a photodiode and a metal-oxide semiconductor (MOS) transistor.

The CMOS image sensor was invented in the 1960s. However, until recently, image quality of the CMOS image sensor was inferior to that of the CCD because of noise such as fixed pattern noise (FPN). In addition, a circuit included in the CMOS image sensor was more complex than that of the CCD. Furthermore, a packing density of the CMOS image sensor was lower than that of the CCD. However, a cost required for manufacturing the CMOS image sensor was substantially the same as that of the CCD. In addition, a size of the CMOS image sensor was relatively larger. Thus, the CMOS image sensor was hardly developed until the 1990s.

However, some disadvantages of the CMOS image sensor started to be overcome in the 1990s by development of CMOS processing technology and improvement of signal processing algorithms in the late 1990s. In addition, some characteristics of the CCD were applied to the CMOS image sensor so that image characteristics of the CMOS image sensor were improved.

The CMOS image sensor is advantageous in that the CMOS image sensor operates with relatively low power. In addition, the CMOS image sensor is capable of allowing random access to image data in pixel regions. Furthermore, the CMOS image sensor is advantageous in that costs for manufacturing the CMOS image sensor may be reduced by employing general CMOS processes.

Currently, because an image sensor such as that of a digital still camera, a camera of a cellular phone or a camera of a door phone is being widely used, the CMOS image sensor is much in demand. Thus, a highly effective CMOS image sensor that can be used in a wide variety of applications is being largely researched.

The CMOS image sensor has a relatively small size and a fine design rule. Thus, in case that aluminum wires are employed in the CMOS image device, processes for manufacturing the CMOS image device may be relatively difficult, compared to employing copper wires. Since copper is a better conductor than aluminum, thinner wires can be formed when copper is used. Accordingly, it is desired that the CMOS image device employ copper wires rather than the aluminum wires.

However, a copper layer that is patterned to form a copper wire may not be easily patterned by a reactive ion etch (RIE) process. Thus, the copper wire may be efficiently formed by a damascene process rather than the RIE process. In case that the copper wire is formed by the damascene process, an opaque capping layer may be further included in the CMOS image device. Particularly, the opaque capping layer may be formed on a transparent insulation layer included in the CMOS image device. The opaque capping layer may prevent copper included in the copper wire from being easily diffused. In addition, the opaque capping layer may serve as an etch stop layer. The opaque capping layer may include an opaque material such as silicon nitride or silicon carbide.

Because the opaque capping layer is opaque, light may hardly pass through the opaque capping layer. Thus, if a portion of the capping layer, positioned over the photodiode, is not removed, the light may not be incident onto the photodiode. If the light is not incident onto the photodiode, the image sensor may not operate.

Thus, the portions of the transparent insulation layer and the opaque capping layer, positioned over the photodiode, are removed by an etching process.

However, if the etching process is excessively performed, the photodiode may be unfortunately exposed. Thus, an exposed portion of the photodiode may be damaged.

On the other hand, if the etching process is insufficiently performed, a residual portion of the opaque capping layer may remain over the photodiode. This residual portion of the opaque capping layer may unfortunately refract the light. In addition, the residual portion of the opaque capping layer may unfortunately block the light. Consequently, the light may not be incident onto the photodiode.

Thus, the etching process has to be controlled so that the photodiode may not be exposed. In addition, the etching process has to be controlled so that the portions of the transparent insulation layer and the opaque capping layer positioned over the photodiode may be clearly removed.

However, if the CMOS image device has a multi-layered structure, there is a difference in thickness between the transparent insulation layers in the multi-layered structure. In addition, the opaque capping layer may be formed between the transparent insulation layers. Thus, it is difficult to completely remove opaque portions over the lowest transparent insulation layer in the etching process without damage to the lowest transparent insulation layer. In addition, the CMOS image device is made to be thin to improve the transmittance of the light. Thus, in case that the etching process is excessively performed, the photodiode under the lowest transparent insulation layer may be damaged as well as the lowest transparent insulation layer. On the other hand, in case that the etching process is not fully performed, the opaque portions over the lowest transparent insulation layer may partially remain. Thus, a margin of the etching process for selectively removing the opaque portions over the lowest transparent insulation layer may unfortunately decrease.

SUMMARY OF THE INVENTION

The present invention provides methods of manufacturing an image device, the methods being capable of efficiently reducing attack damage to a photodiode and improving a transmittance of a light incident onto the photodiode.

In accordance with some embodiments of the present invention, there is provided a method of manufacturing an image device. In the method, a first structure is formed on a substrate having a photodiode. The first structure includes an upper portion and a lower portion. The upper portion is opaque. The lower portion is transparent. An etch stop layer pattern is formed on the first structure. The etch stop layer pattern is positioned over the photodiode. A second structure is formed on the first structure to cover the etch stop layer pattern. The second structure has at least one opaque capping layer. An opening is formed over the photodiode by partially etching the second structure, the etch stop layer pattern and the upper portion of the first structure. The opening exposes the lower portion of the first structure.

In some embodiments of the present invention, a method of manufacturing an image device is provided. In the method, a photodiode is formed in a first region of a substrate including the first region and a second region. A first structure is formed on the substrate. The first structure includes an upper portion and a lower portion. The upper portion is opaque. The lower portion is transparent. The first structure includes a wire and a capacitor lower electrode that are formed through the first structure. The wire is formed over the first region. The wire is not positioned over the photodiode. The capacitor lower electrode is formed over the second region. A dielectric layer is formed on the first structure, the wire and the capacitor lower electrode. An etch stop layer pattern and a capacitor upper electrode are formed on the dielectric layer. The etch stop layer pattern is positioned over the photodiode. The capacitor upper electrode is positioned over the capacitor lower electrode. A second structure including at least one opaque capping layer is formed on the etch stop layer pattern and the first structure. An opening is formed over the photodiode by etching the second structure, the etch stop layer pattern and the upper portion of the first structure. The opening exposes the lower portion of the first structure.

According to one or more aspects of the present invention, a first structure including a transparent lower portion and an opaque upper portion is formed on a substrate having a photodiode. An etch stop layer pattern positioned over the photodiode is formed on the first structure. A second structure having at least one opaque capping layer is formed on the first structure to cover the etch stop layer pattern. An opening partially exposing the lower portion of the first structure is formed over the photodiode by performing an etching process for etching the second structure, the etch stop layer pattern and the opaque upper portion of the first structure. Because the etch stop layer pattern may prevent the transparent lower portion of the first structure from being etched in the etching process, the photodiode positioned under the transparent lower portion of the first structure may be efficiently protected in the etching process. In addition, a decrease of a light transmittance due to a residual portion of the opaque upper portion of the first structure may be efficiently prevented. Thus, electrical characteristics and reliability of an image device may be improved.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION

Figure 1:
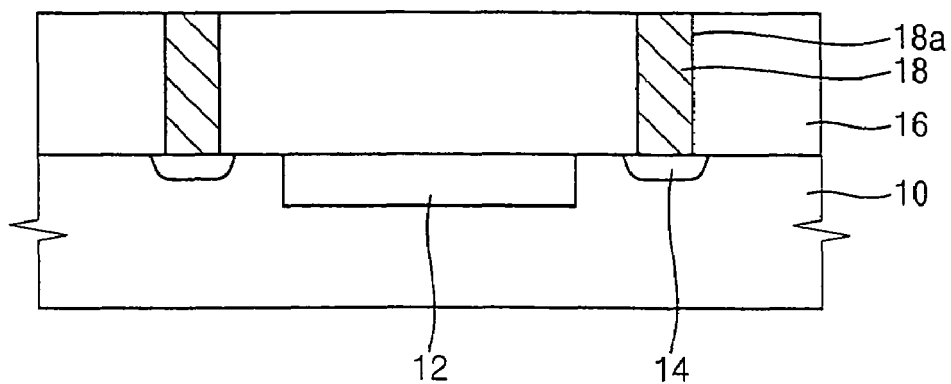
FIGS. 1 to 12 are cross-sectional views illustrating methods of manufacturing an image device in accordance with some embodiments disclosed herein.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the sizes and relative sizes of layers and regions may be exaggerated for clarity. The drawings are not to scale. Like reference numerals refer to like elements throughout.

It will be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

FIGS. 1 to 12 are cross-sectional views illustrating methods of manufacturing an image device in accordance with some embodiments.

Referring to FIG. 1, an isolation layer (not shown) is formed at a surface of substrate 10 so that substrate 10 may be divided into an isolation region and an active region. Here, the isolation layer corresponds to the isolation region. The active region corresponds to a portion of substrate 10 enclosing the isolation region.

A photodiode 12 is formed at a surface portion of the active region. An upper surface of photodiode 12 may be exposed from the active region. Photodiode 12 is a kind of a photo detector. A transistor (not shown) electrically connected to photodiode 12 may be formed on substrate 10. The transistor may be used as a switching device of photodiode 12.

A first lower transparent insulation layer 16 is formed on substrate 10 to cover the transistor and photodiode 12. First lower transparent insulation layer 16 may have a thickness of about 1,500 Å to about 3,000 Å. First lower transparent insulation layer 16 may include a transparent material such as silicon oxide.

A photolithography process may be performed on first lower transparent insulation layer 16 so that first contact hole 18a may be formed through first lower insulation layer 16. First contact hole 18a may expose source/drain region 14 or a gate electrode of the transistor. However, first contact hole 18a may not expose photodiode 12.

A lower metal material layer (not shown) is formed on lower transparent insulation layer 16 to fill up first contact hole 18a. The lower metal material layer may be formed by a chemical vapor deposition process or a sputtering process.

The lower metal material layer may include a metal such as copper, titanium or tungsten. Copper may be easily diffused into substrate 10. Thus, in case that the metal is copper, a defect may be unfortunately formed in substrate 10. As a result, the lower metal material layer may be advantageously formed using titanium or tungsten rather than copper.

If the metal is copper, then a barrier metal material layer may be formed before the lower metal material layer including copper is formed. The barrier metal material layer may prevent copper from being easily diffused into substrate 10. Thus, the defect may not be generated.

The lower metal material layer is polished by a planarizing process such as a chemical mechanical polishing (CMP) process until first lower transparent insulation layer 16 is exposed. Thus, first contact 18 may be formed in first contact hole 18a.

Figure 2:
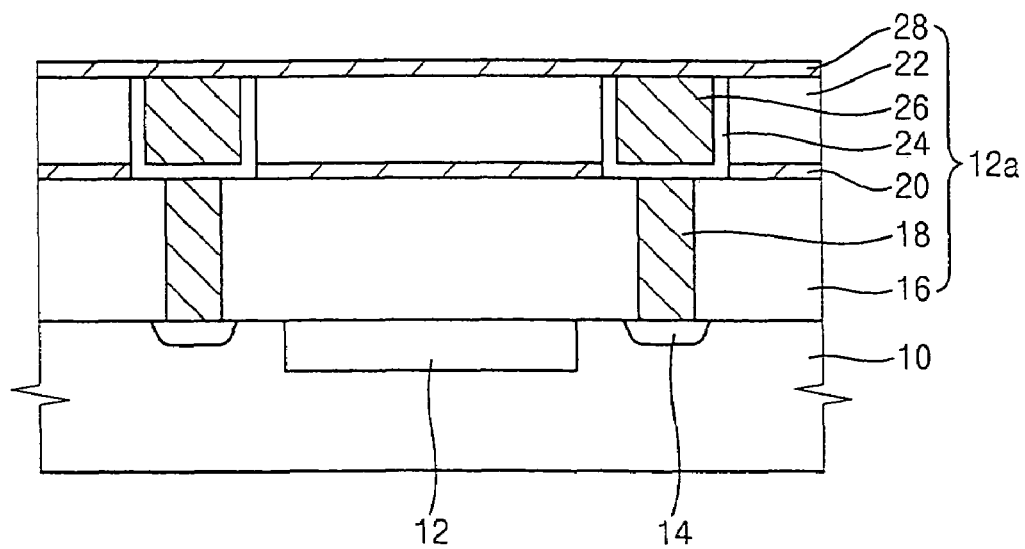

Referring to FIG. 2, first lower opaque capping layer 20 is formed on first lower transparent insulation layer 16 and first contact 18. First lower opaque capping layer 20 may prevent the metal included in first contact 18 from being easily diffused. In addition, first lower opaque capping layer 20 may be used as an etch stop layer so that first upper transparent insulation layer 22 subsequently formed on first lower opaque capping layer 20 may be efficiently etched to form a first trench. Because first lower opaque capping layer 20 may be used as the etch stop layer, first lower opaque capping layer 20 may have a substantially high etching selectivity with respect to first upper transparent insulation layer 22. In particular, if first upper transparent insulation layer 22 includes silicon oxide, then first lower opaque capping layer 20 may include silicon nitride (SiN), silicon oxynitride (SiON) or silicon carbide (SiC). These may be used alone or in combination.

First lower opaque capping layer 20 may be a single-layered structure. Alternatively, first lower opaque capping layer 20 may be a multi-layered structure including at least two layers that include different materials. First lower opaque capping layer 20 may have a thickness of about 100 Å to about 1,000 Å.

First upper transparent insulation layer 22 is then formed on first lower opaque capping layer 20. First upper transparent insulation layer 22 may be formed using a transparent material such as silicon oxide. First ancillary wire 26 may be formed inside first upper transparent insulation layer 22 by sequential processes. Thus, first upper transparent insulation layer 22 may have a thickness substantially greater than that of first ancillary wire 26.

If first ancillary wire 26 includes copper having a relatively low electrical resistance, then a height of first ancillary wire 26 may be less than that of first ancillary wire 26 including aluminum instead of copper.

A height of first upper transparent insulation layer 22 may vary in accordance with an electrical resistance of first ancillary wire 26. For example, first upper transparent insulation layer 22 may have a height of about 1,000 Å to about 3,000 Å.

Thereafter, first upper transparent insulation layer 22 and first lower opaque capping layer 20 are partially etched so that the first trench (not shown) exposing first contact 18 may be formed. The first trench may have a line shape. The first trench may be positioned directly over first contact 18. That is, the first trench may not be positioned over photodiode 12.

A first barrier metal material layer (not shown) may be uniformly formed on an inner surface of the first trench and an upper surface of transparent insulation layer 22. The first barrier metal material layer may prevent copper included in first ancillary wire 26 from being easily diffused into first upper transparent insulation layer 22. Particularly, the first barrier metal material layer may be formed using titanium, titanium nitride, tantalum or tantalum nitride. The first barrier metal material layer may be a single-layered structure. Alternatively, the first barrier metal material layer may be a multi-layered structure having at lease two layers that include different materials.

A first copper layer (not shown) is formed on the first barrier metal material layer. The first copper layer may fill up the first trench that is partially filled with the first barrier metal material layer. The first copper layer may be formed by an electroplating process. The electroplating process may be performed after a copper seed is formed on the first barrier metal material layer by a sputtering process. Alternatively, the first copper layer may be formed by a non-electrolytic plating process.

The first copper layer and the first barrier metal material layer are planarized by a CMP process until first upper transparent insulation layer 22 is exposed. Thus, first ancillary wire 26 and first barrier metal material layer pattern 24 may be formed inside the first trench. First ancillary wire 26 may have a line shape. First ancillary wire 26 may be electrically connected to first contact 18.

A first wire includes first contact 18, first barrier metal material layer pattern 24 and first ancillary wire 26. The first wire may not be positioned directly over photodiode 12. Thus, light incident onto photodiode 12 may not be blocked by the first wire. That is, the light may not be absorbed by the first wire.

A first upper opaque capping layer 28 is then formed on first ancillary wire 26, first upper transparent insulation layer 22 and first barrier metal material layer pattern 24. First upper opaque capping layer 28 may prevent copper included in first ancillary wire 26 from being diffused. First upper opaque capping layer 28 may include silicon nitride or silicon carbide. These may be used alone or in combination. If the thickness of first upper opaque capping layer 28 is less than about 1,000 Å, it is disadvantageous in that first upper opaque capping layer 28 may not efficiently prevent copper included in first ancillary wire 26 from being diffused. If the thickness of first upper opaque capping layer 28 is more than about 1,000 Å, an intensity of the light incident onto photodiode 12 may unfortunately decrease while the light passes through first upper opaque capping layer 28. Thus, the thickness of first upper opaque capping layer 28 may be about 100 Å to about 1,000 Å.

As a result, first structure 12a including first lower transparent insulation layer 16, first contact 18, first lower opaque capping layer 20, first upper transparent insulation layer 22, first barrier metal material layer pattern 24, first ancillary wire 26 and first upper opaque capping layer 28 may be formed on substrate 10 including photodiode 12 by processes illustrated in FIGS. 1 and 2.

Figure 3:
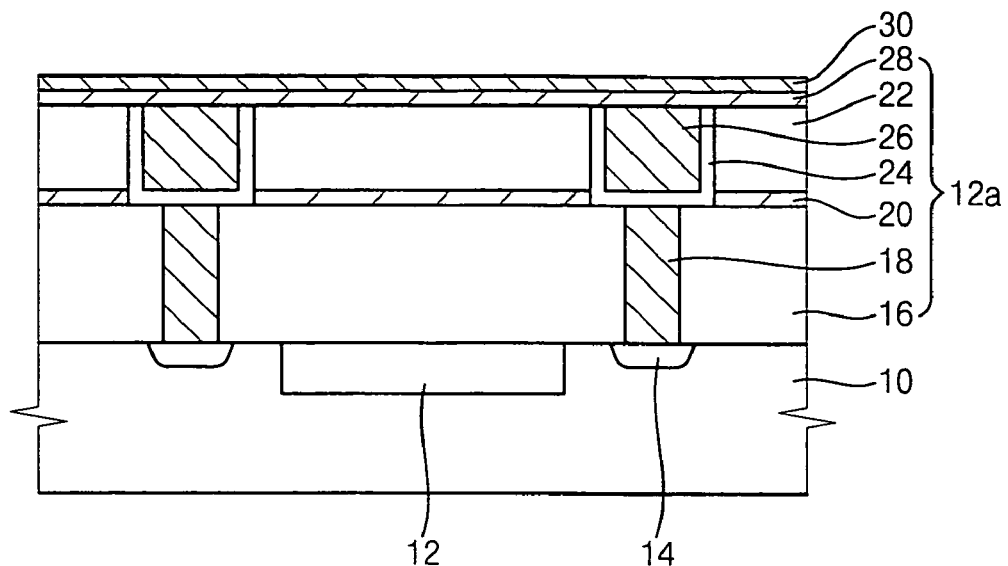

Referring to FIG. 3, etch stop layer 30 may be formed on first upper opaque capping layer 28. Etch stop layer 30 may include a metal material such as metal or metal nitride. The metal material may have a substantially large etching selectivity with respect to a material included in a transparent insulation layer or an opaque capping layer. Particularly, the material may be silicon nitride, silicon carbide, silicon oxynitride or silicon oxide. These may be used alone or in combination. Thus, etch stop layer 30 may be hardly etched in etching the transparent insulation layer or the opaque capping layer.

The metal material included in-etch stop layer 30 may be titanium, titanium nitride, tantalum or tantalum nitride. These materials may be used alone or in combination. Etch stop layer 30 may be a single-layered structure. Alternatively, etch stop layer 30 may be a multi-layered structure having at least two layers that include different materials.

Figure 4:
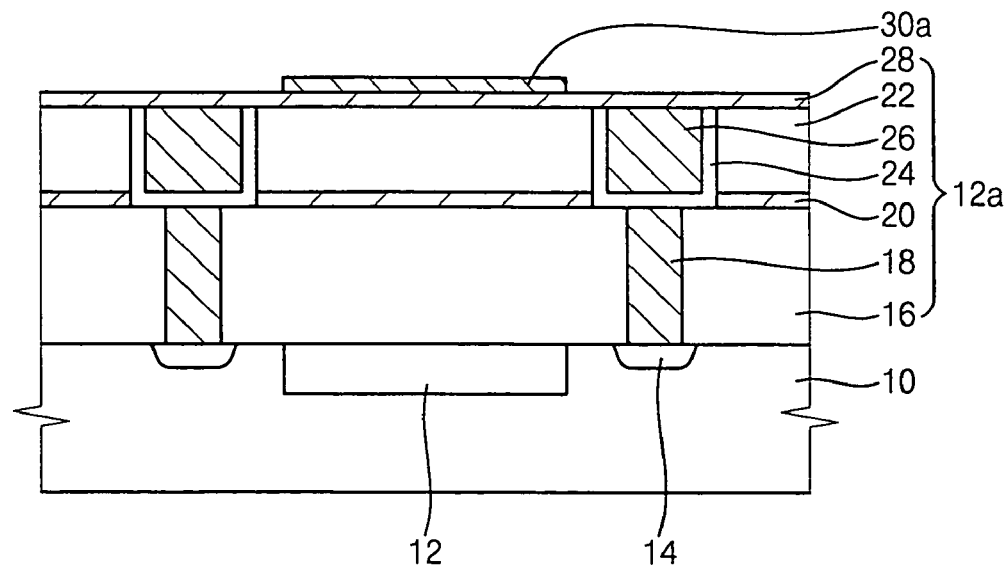

Referring to FIG. 4, etch stop layer 30 is partially etched so that etch stop layer pattern 30a may be formed on first upper opaque capping layer 28. In particular, etch stop layer pattern 30a may be located directly over photodiode 12.

A first etching process subsequently performed for forming first preliminary opening 64 (see FIG. 9) may be stopped with the aid of etch stop layer pattern 30a. Thus, a width of etch stop layer pattern 30a may be substantially wider than that of first preliminary opening 64.

In addition, etch stop layer pattern 30a may be positioned over photodiode 12. If etch stop layer pattern 30a is not positioned over photodiode 12, photodiode 12 may be unfortunately damaged by subsequent etching processes.

In addition, etch stop layer pattern 30a may not be positioned over the first wire. If etch stop layer pattern 30a is positioned over the first wire, an electrical short may be unfortunately generated.

Figure 5:
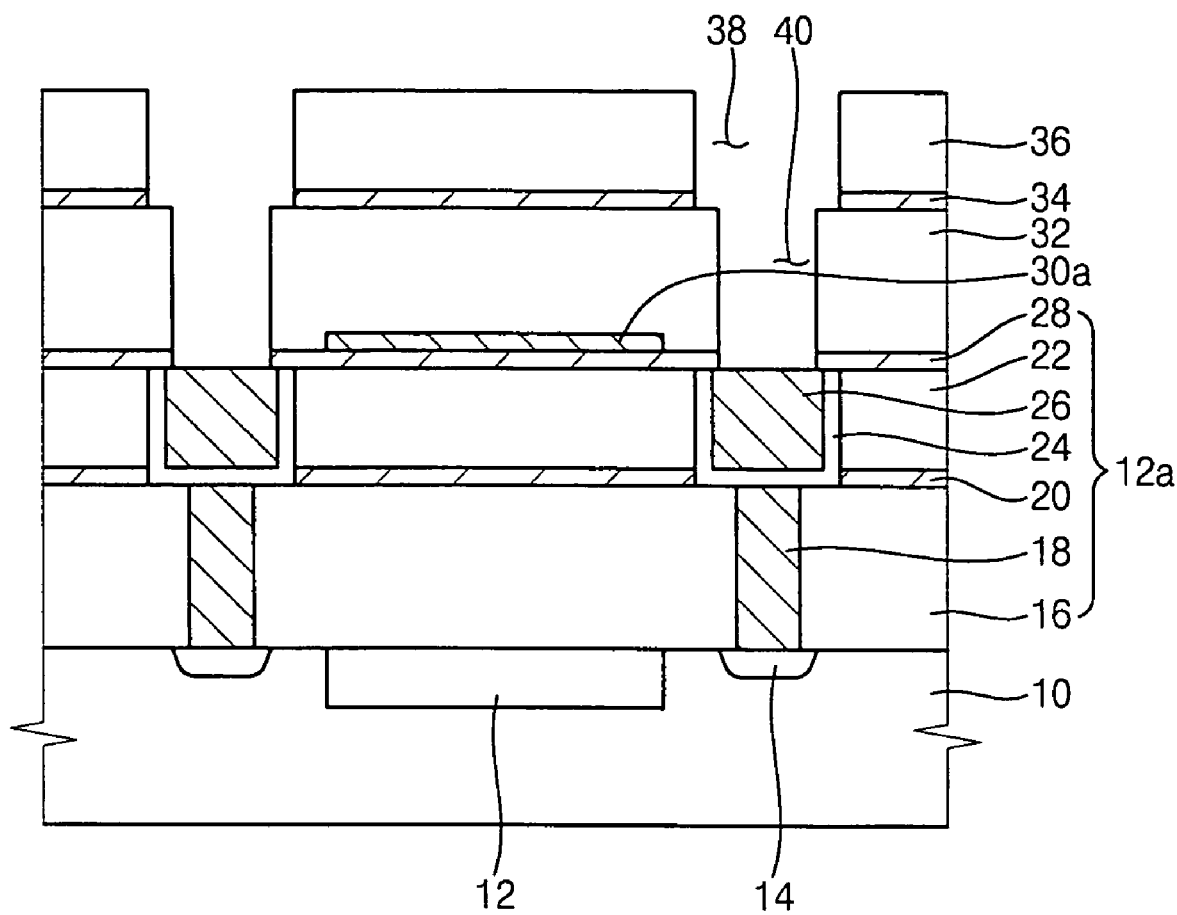

Referring to FIG. 5, second lower transparent insulation layer 32 is formed on etch stop layer pattern 30a and first upper opaque capping layer 28. Second lower transparent insulation layer 32 may be formed using a transparent material such as silicon oxide. Second lower transparent insulation layer 32 may have a thickness of about 1,000 Å to about 3,000 Å.

A second lower opaque capping layer 34 may be formed on second lower transparent insulation layer 32. Second lower opaque capping layer 34 may be formed using silicon nitride, silicon oxynitride or silicon carbide. These may be used alone or in combination. Second lower opaque capping layer 34 may have a thickness of about 100 Å to about 1,000 Å.

Second upper transparent insulation layer 36 may be formed on second lower opaque capping layer 34. Second upper transparent insulation layer 36 may be formed using a material substantially the same as that included in second lower transparent insulation layer 32.

Second upper transparent insulation layer 36, second lower opaque capping layer 34, second lower transparent insulation layer 32 and first upper opaque capping layer 28 are sequentially etched so that second contact hole 40 and second trench 38 may be formed through second upper transparent insulation layer 36, second lower opaque capping layer 34, second lower transparent insulation layer 32 and first upper opaque capping layer 28. Second contact hole 40 may be communicated with second trench 38. That is, second contact hole 40 may be disposed adjacent and beneath second trench 38.

Particularly, second contact hole 40 may be formed through second lower transparent insulation layer 32 and first upper opaque capping layer 28. Second trench 38 may be formed through second upper transparent insulation layer 36 and second lower opaque capping layer 34. First ancillary wire 26 may be partially exposed through second trench 38 and second contact hole 40.

Second trench 38 may be formed after second contact hole 40 is formed. That is, second trench 38 and second contact hole 40 may be formed by a via-first process. Alternatively, second contact hole 40 may be formed after second trench 38 is formed. That is, second contact hole 40 and second trench 38 may be formed by a trench-first process.

Figure 6:
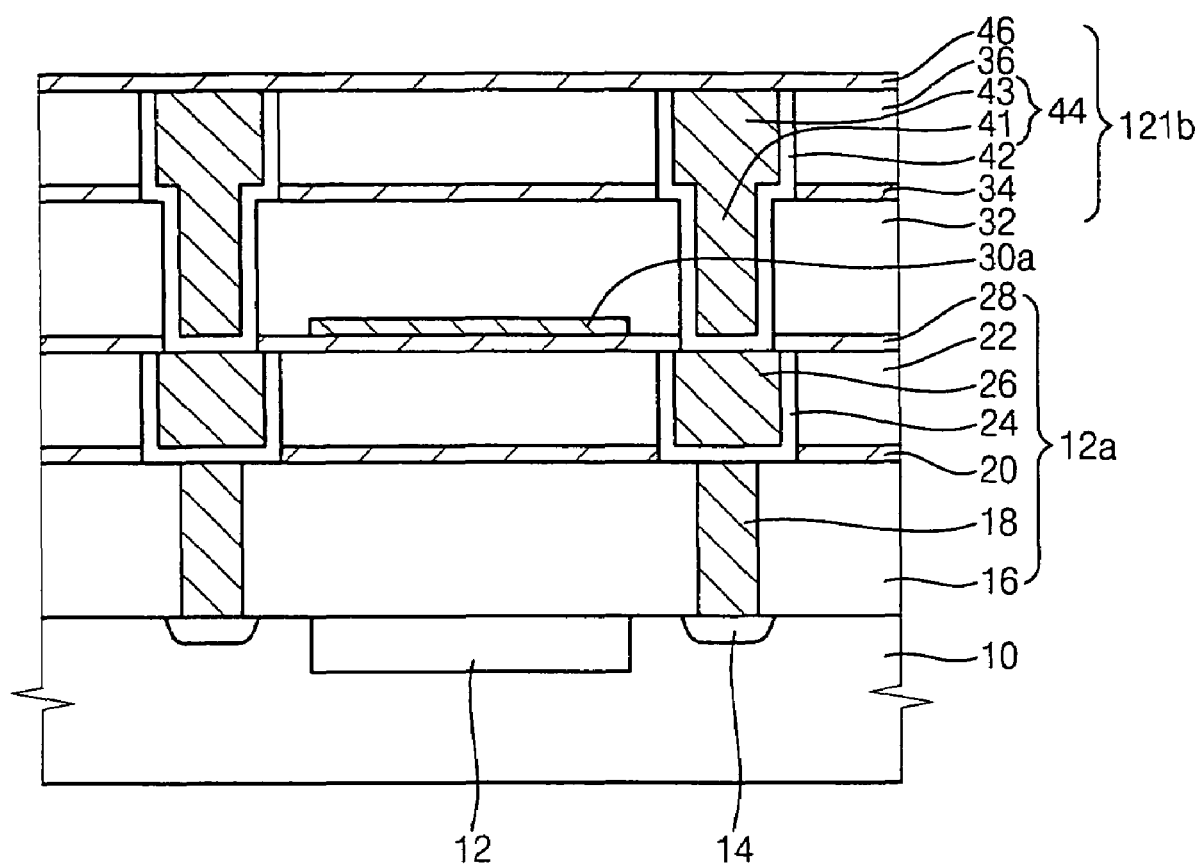

Referring to FIG. 6, a second barrier metal material layer (not shown) may be continuously formed on second upper transparent insulation layer 36, an inner surface of second trench 38, and an inner surface of second contact hole 40. The second barrier metal material layer may have a substantially uniform thickness.

A copper layer (not shown) filling up second trench 38 and second contact hole 40 is formed on the second barrier metal material layer. That is, second trench 38 and second contact hole 40 partially filled with the second barrier metal material layer may be fully filled with the copper layer.

Thereafter, the second copper layer and the second barrier metal material layer are polished by a CMP process until second upper transparent insulation layer 36 is exposed. Thus, second wire 44 and second barrier metal material layer pattern 42 may be formed in second trench 38 and second contact hole 40. That is, second wire 44 including copper may fill up second trench 38 and second contact hole 40 that are partially filled with second barrier metal material layer pattern 42.

Second wire 44 may include second contact 41 and second ancillary wire 43. Second contact 41 and second ancillary wire 43 may be formed as one body. Particularly, second contact 41 may correspond to lower portion of second wire 44. Second ancillary wire 43 may correspond to an upper portion of second wire 44. Second contact 41 may be electrically connected between second ancillary wire 43 and first ancillary wire 26.

A second upper opaque capping layer 46 is then formed on second wire 44, second barrier metal material layer pattern 42 and second upper transparent insulation layer 36. Second upper opaque capping layer 46 may have a substantially uniform thickness.

Figure 7:
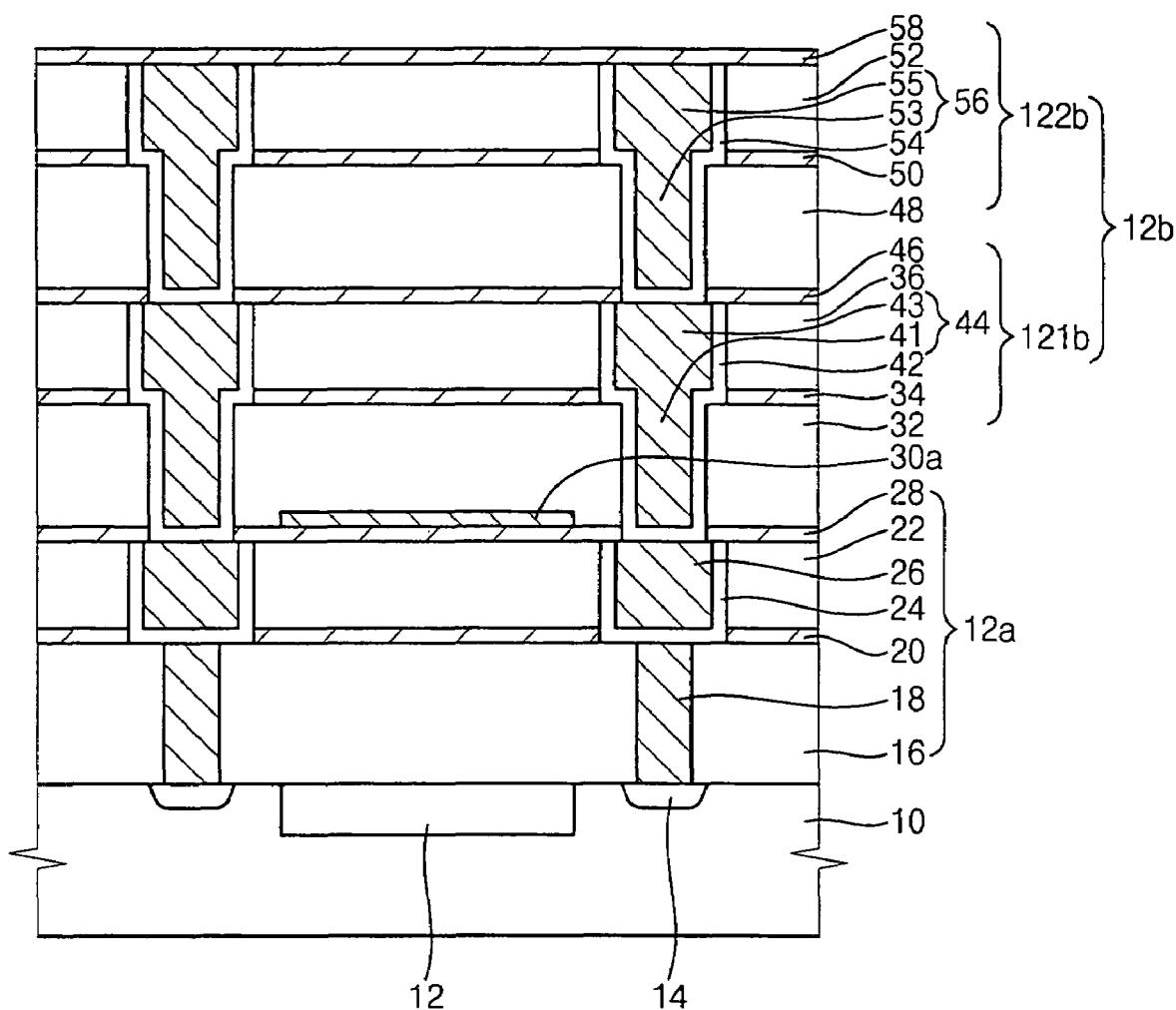

Referring to FIG. 7, additional lower transparent insulation layer 48, additional lower opaque capping layer 50 and additional upper transparent insulation layer 52 are formed on second upper opaque capping layer 46 by processes substantially the same as those already illustrated in FIGS. 5 and 6.

An additional wire 56 is then formed through additional lower transparent insulation layer 48, additional lower opaque capping layer 50 and additional upper transparent insulation layer 52. Additional wire 56 may be electrically connected to second wire 44.

Additional wire 56 may include additional contact 53 and additional ancillary wire 55. Additional contact 53 and additional ancillary wire 55 may be formed as one body. Particularly, additional contact 53 may correspond to lower portion of additional wire 56. Additional ancillary wire 55 may correspond to an upper portion of additional wire 56. Additional contact 53 may be electrically connected between additional ancillary wire 55 and second ancillary wire 43.

An additional upper opaque capping layer 58 may be formed on additional wire 56, additional upper transparent insulation layer 52 and additional second barrier metal material layer pattern 54.

As a result, second structure 12b may be formed on first structure 12a and etch stop layer pattern 30a by performing processes illustrated in FIGS. 5 to 7.

Second structure 12b may include lower structure 121b and upper structure 122b formed on lower structure 121b. Lower structure 121b may include second lower transparent insulation layer 32, second lower opaque capping layer 34, second transparent insulation layer 36, second barrier metal material layer pattern 42, second wire 44 and second upper opaque capping layer 46. Upper structure 122b may include additional lower transparent insulation layer 48, additional lower opaque capping layer 50, additional upper transparent insulation layer 52, additional second barrier metal material layer pattern 54, additional wire 56 and additional upper opaque capping layer 58.

In some embodiments, processes for forming upper structure 122b may be performed at least twice after lower structure 121b is formed on first structure 12a and etch stop layer pattern 30a. Thus, second structure 12b may include at least two upper structures 122b.

In some embodiments, second structure 12b may include lower structure 121b alone. That is, processes for forming upper structure 122b may not be performed.

Figure 8:
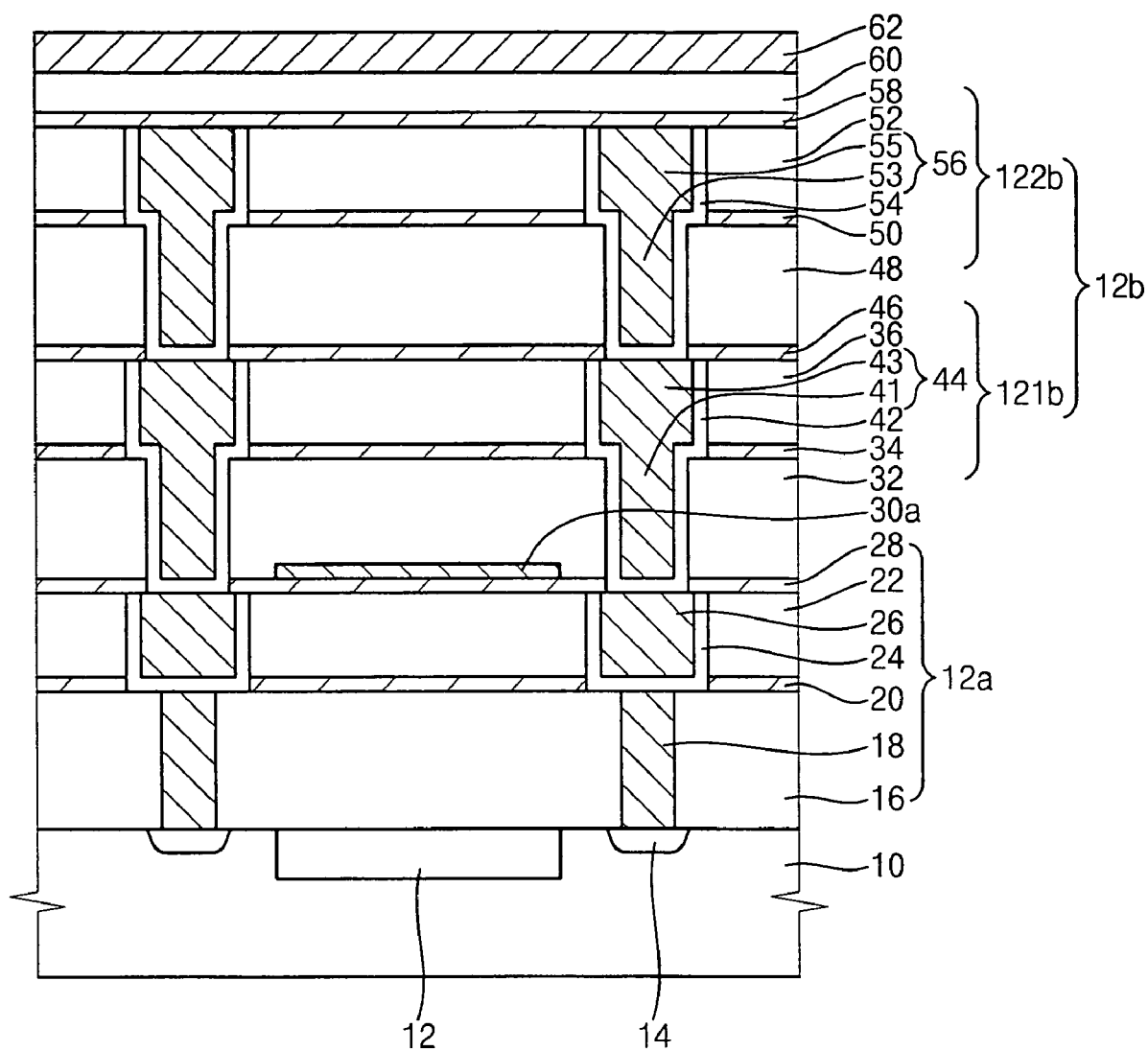

Referring to FIG. 8, first protection layer 60 is formed on additional upper opaque capping layer 58. Thus, second structure 12b, etch stop layer pattern 30a and first structure 12a that are positioned below first protection layer 60 may be protected.

First protection layer 60 may be formed using silicon oxide such as flowable silicon glass (FSG) or tetraethyl orthosilicate (TEOS).

If the thickness of first protection layer 60 is less than about 100 Å, it is disadvantageous in that second structure 12b, etch stop layer pattern 30a and first structure 12a may not be efficiently protected. On the other hand, if the thickness of first protection layer 60 is greater than about 3,000 Å, the time required for etching first protection layer 60 may be unfortunately long. Thus, the thickness of first protection layer 60 may be about 100 Å to about 3,000 Å.

A second protection layer 62 is formed on first protection layer 60. Second protection layer 62 may also protect second structure 12b, etch stop layer pattern 30a and first structure 12a. Second protection layer 62 may include silicon nitride, silicon oxynitride or silicon carbide. These may be used alone or in combination. Second protection layer 62 may have a thickness of about 100 Å to about 3,000 Å.

As described above, etch stop layer pattern 30a including the metal material may be formed below second structure 12b. Thus, the first etching process may be efficiently controlled. In addition, although first protection layer 60 and second protection layer 62 have relatively thin thicknesses, the first etching process may be efficiently performed without damaging photodiode 12.

As described above, second protection layer 62 is formed on first protection layer 60. As one alternative, first protection layer 60 may be formed alone without second protection layer 62. In this case, first protection layer 60 may have a relatively greater thickness. As another alternative, second protection layer 62 alone may be formed without forming first protection layer 60. In this case, second protection layer 62 may have a relatively greater thickness.

Figure 9:
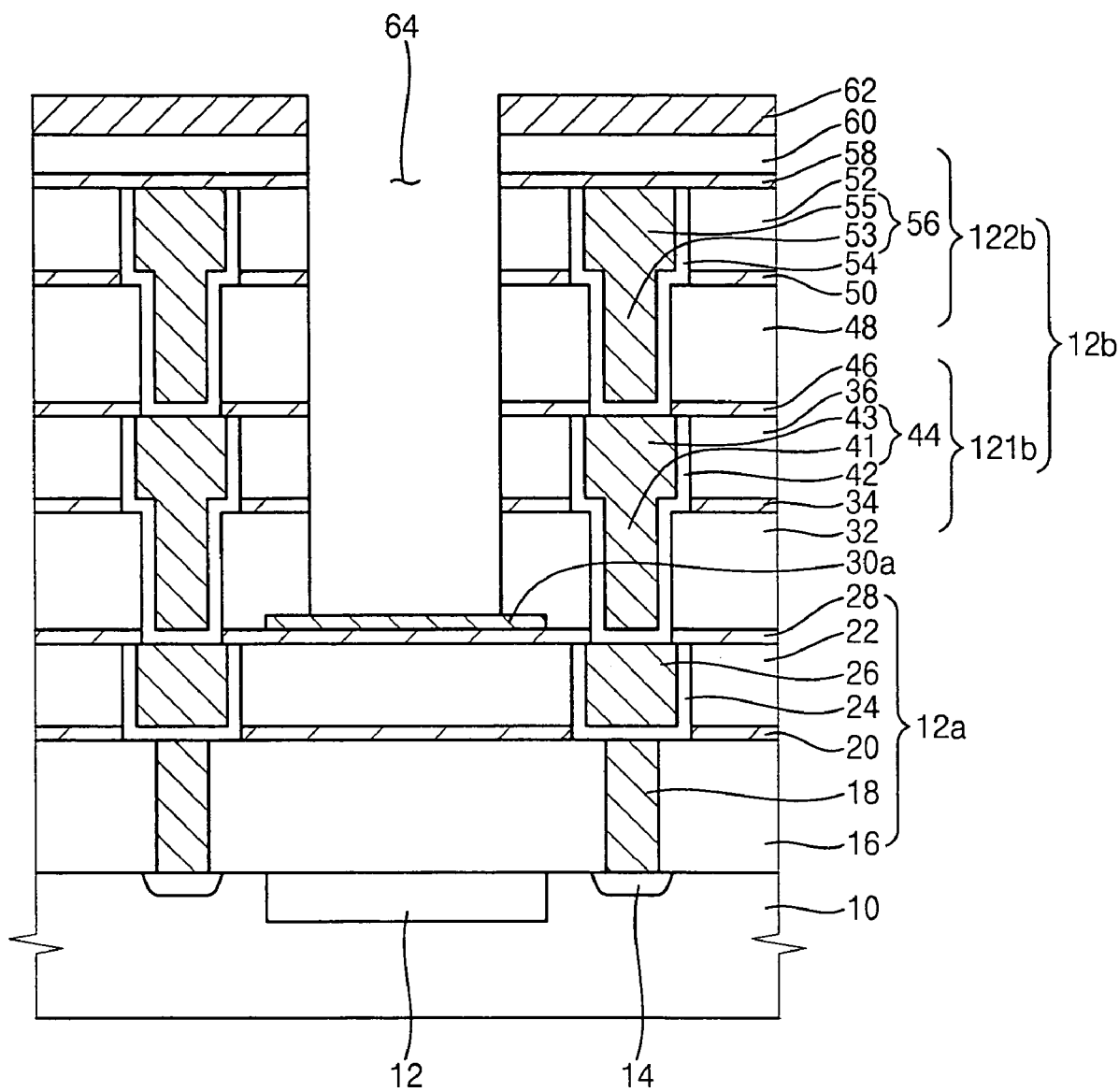

Referring to FIG. 9, a photoresist pattern (not shown) is formed on second protection layer 62. The photoresist pattern may have an opening positioned directly over photodiode 12. The first etching process may be performed on second protection layer 62, first protection layer 60 and second structure 12b so that first preliminary opening 64 that partially exposes etch stop layer pattern 30a may be formed.

As described above, second structure 12b includes at least one transparent insulation layer and at least one opaque capping layer. Particularly, the transparent insulation layers included in second structure 12b are second lower transparent insulation layer 32, second upper transparent insulation layer 36, additional lower transparent insulation layer 48 and additional upper transparent insulation layer 52. In addition, the opaque capping layers included in second structure 12b are second lower opaque capping layer 34, second upper opaque capping layer 46, additional lower opaque capping layer 50 and additional upper opaque capping layer 58.

The transparent insulation layers may include silicon oxide. On the other hand, the opaque capping layers may include silicon nitride, silicon oxynitride or silicon carbide. These may be used alone or in combination.

The transparent insulation layers and the opaque capping layers may be relatively thin. For example, beneficially the thicknesses of the transparent insulation layers are no more than about 3,000 Å and the thicknesses of the opaque capping layers are also no more than about 3,000 Å.

Additional upper opaque capping layer 58, additional upper transparent insulation layer 52, additional lower opaque capping layer 50, additional lower transparent insulation layer 48, second upper opaque capping layer 46, second upper transparent insulation layer 36, second lower opaque capping layer 34 and second lower transparent insulation layer 32 are successively etched so that first preliminary opening 64 exposing etch stop layer pattern 30a may be formed.

That is, second wire 44 and additional wire 56 may not be formed directly over photodiode 12. Thus, portions of second protection layer 62, first protection layer 60 and second structure 12b, positioned directly over photodiode 12, may be efficiently removed by the first etching process to form first preliminary opening 64.

As described above, second structure 12b has a multi-layered structure that includes at least two layers. In general, the multi-layered structure may have an irregular thickness. This is because a thickness uniformity of the layer may be easily deteriorated by fine variations generated in forming the layers. Thus, the openings are simultaneously formed through the multi-layered structure by an etching process. However, depths of the openings may not be uniform because of relatively low thickness uniformity of the layers.

On the other hand, if etch stop layer pattern 30a, which is hardly etched by the etching process, is formed below the multi-layered structure, the etching process may be efficiently performed. This is because the etching process may be automatically stopped by etch stop layer pattern 30a. Thus, although the multi-layered structure has the irregular thickness, the depths of the openings may be uniform.

Figure 10:
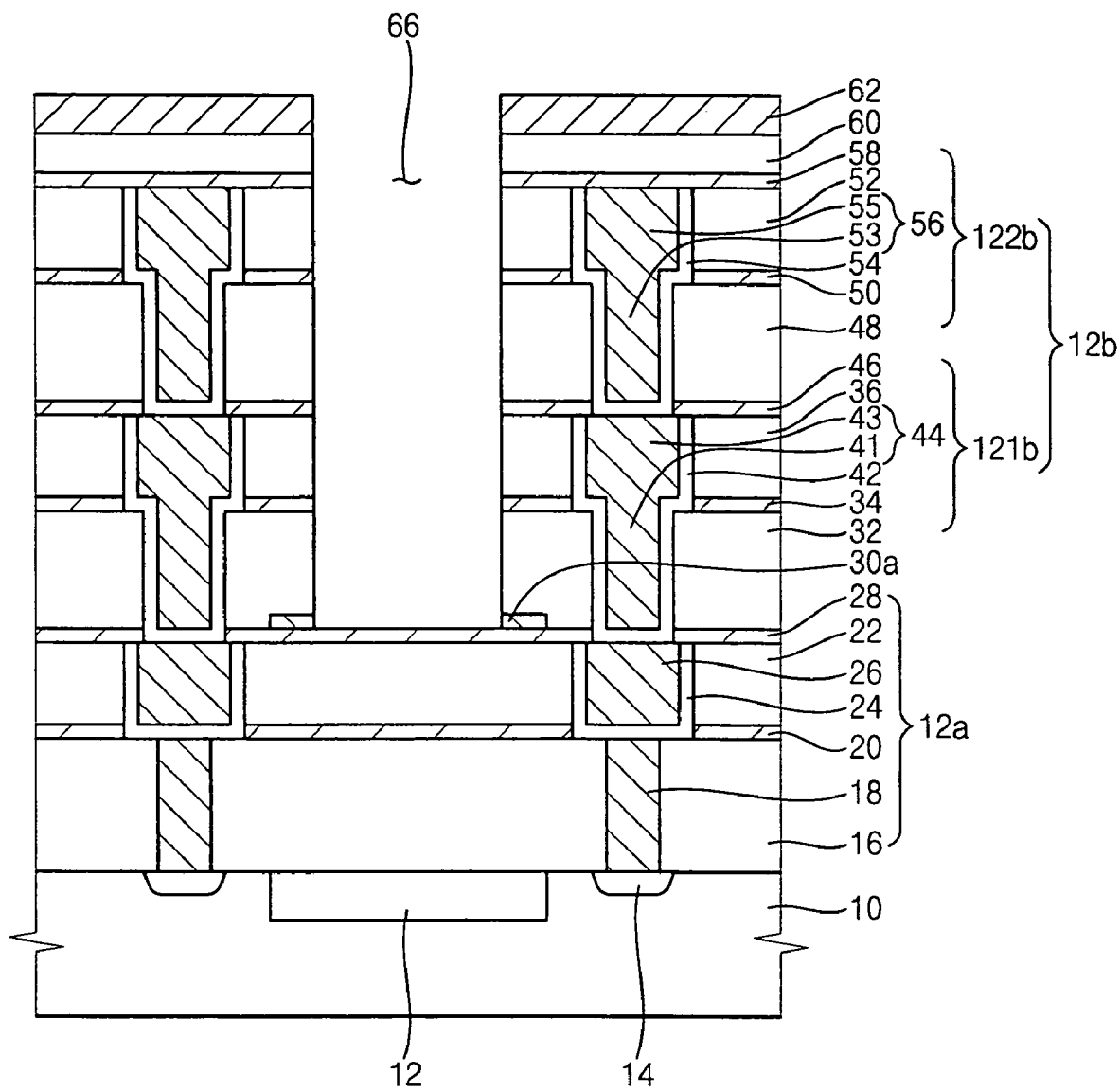

Referring to FIG. 10, a portion of etch stop layer pattern 30a, exposed through first preliminary opening 64, is removed so that second preliminary opening 66 partially exposing first upper opaque capping layer 28 may be formed.

Figure 11:
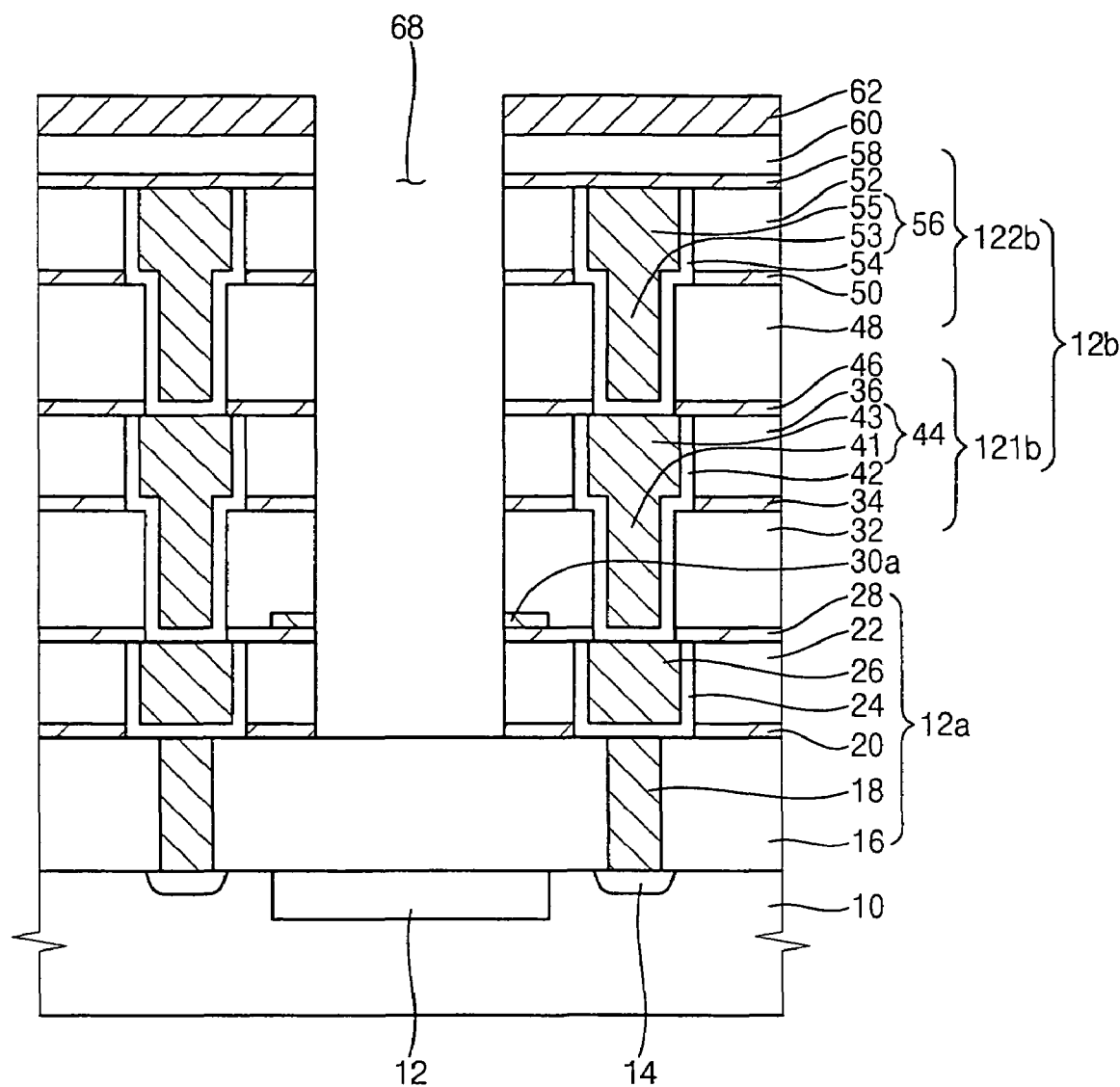

Referring to FIG. 11, a second etching process is performed on first upper opaque capping layer 28, first upper transparent insulation layer 22 and first lower opaque capping layer 20 so that opening 68 partially exposing first lower transparent insulation layer 16 may be formed.

If first lower transparent insulation layer 16 is etched by the second etching process, the light incident onto first lower transparent insulation layer 16 may be unfortunately refracted. In addition, photodiode 12 may be unfortunately damaged. Thus, first lower transparent insulation layer 16 may be hardly etched by the second etching process.

In the second etching process, only first upper opaque capping layer 28, first upper transparent insulation layer 22 and first lower opaque capping layer 20 may be etched. That is, an etch target thickness of the second etching process is relatively thin.

Thus, the second etching process may be fully controlled by adjusting an etch time alone. As a result, first lower opaque capping layer 20 alone may be efficiently removed by the second etching process without removing first lower transparent insulation layer 16.

Consequently, a residual portion of first lower opaque capping layer 20 may hardly remain over photodiode 12 after the second etching process. In addition, first lower transparent insulation layer 16 may be hardly etched by the second etching process.

Figure 12:
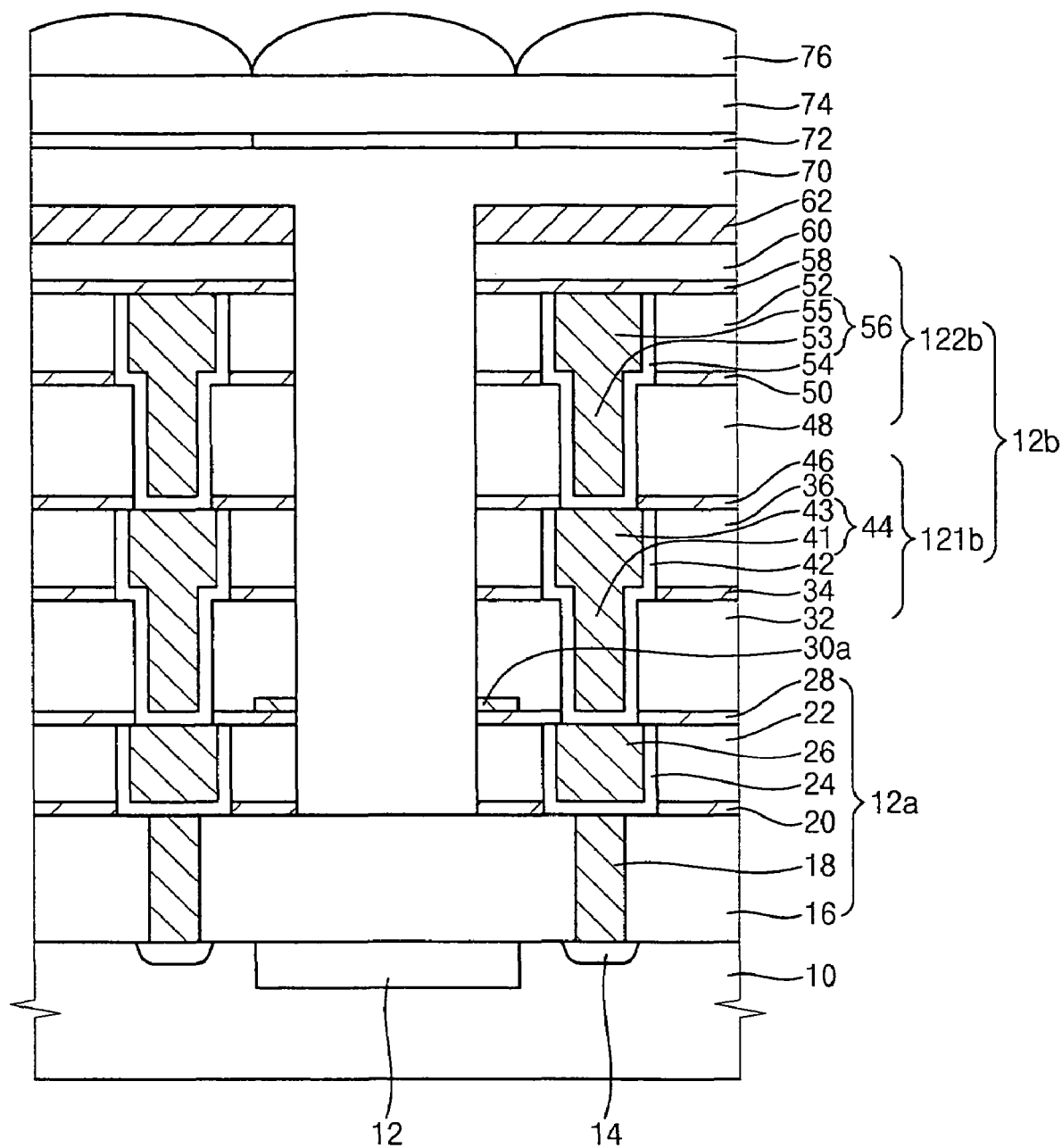

Referring to FIG. 12, first uppermost insulation layer 70 filling up opening 68 is formed on second protection layer 62. First uppermost insulation layer 70 may include a transparent material. An upper portion of first uppermost insulation layer 70 may be then planarized.

A color filter 72 may be formed on first uppermost insulation layer 70. Color filter 72 may include a red color filter portion, a green color filter portion and a blue color filter portion.

A second uppermost insulation layer 74 may be formed on color filter 72. Micro lens 76 is then formed on second uppermost insulation layer 74 so that an image device such as a complementary metal-oxide semiconductor (CMOS) image sensor may be manufactured. Micro lens 76 may concentrate light on photodiode 12. Micro lens 76 may have a substantially hemispherical shape.

Figure 13:
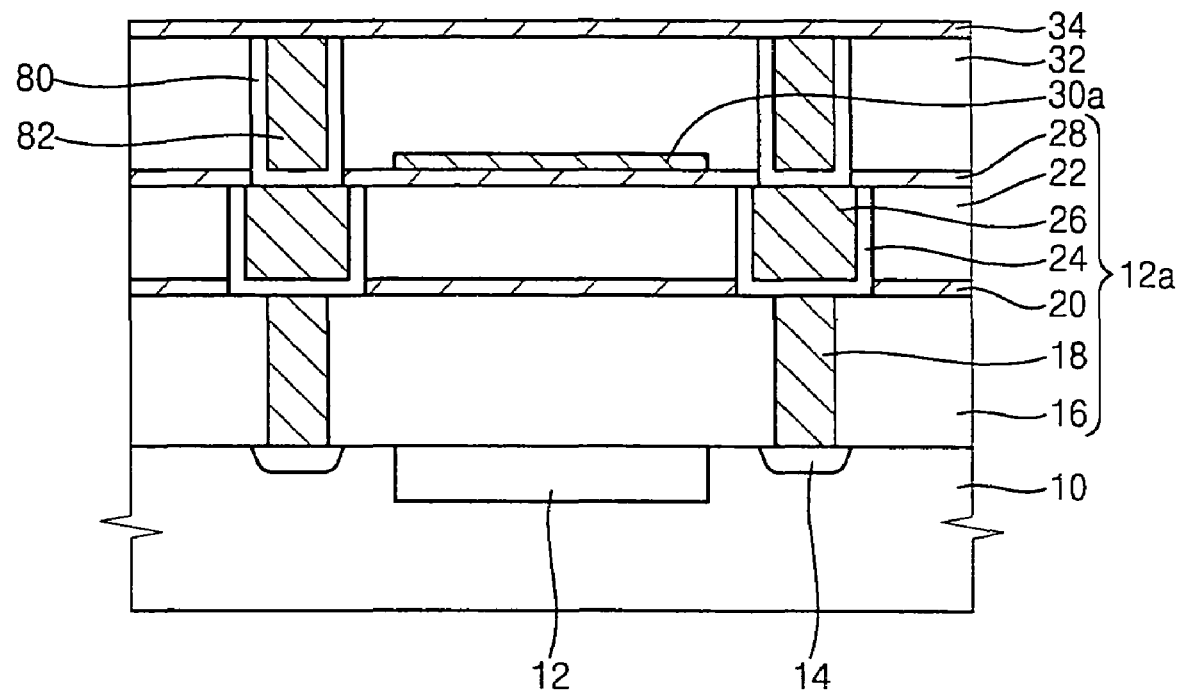
FIGS. 13 to 15 are cross-sectional views illustrating methods of manufacturing an image device in accordance with some other embodiments disclosed herein.
Figure 14:
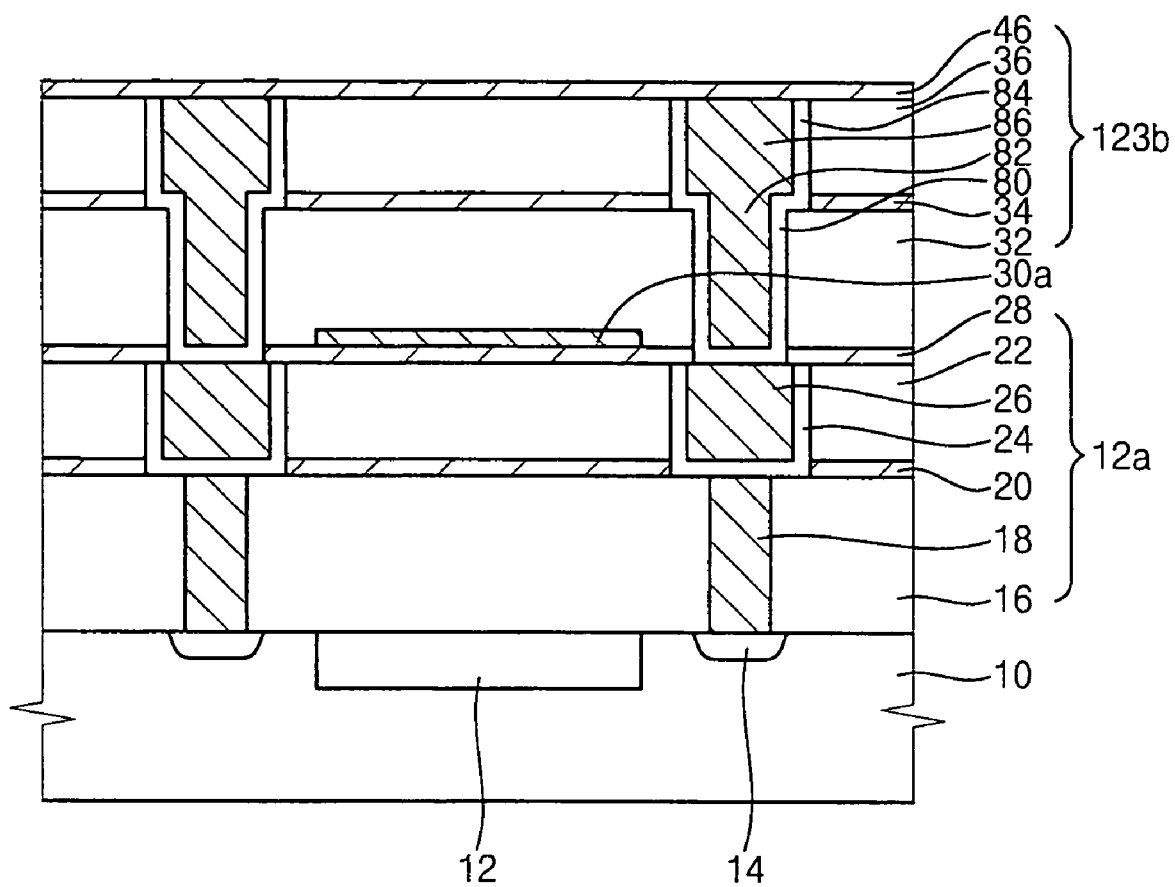
Figure 15:
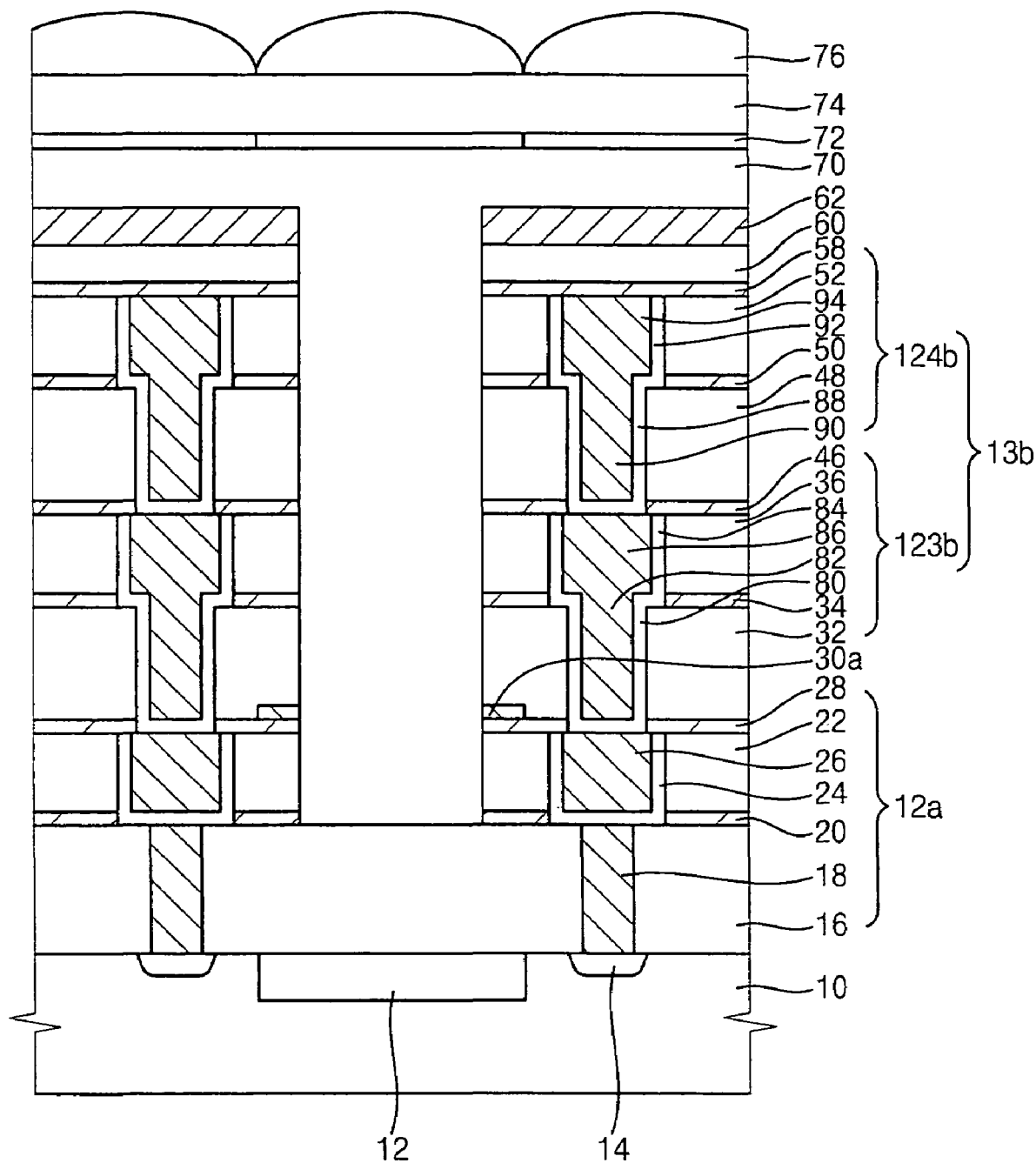

FIGS. 13 to 15 are cross-sectional views illustrating methods of manufacturing an image device in accordance with some other embodiments.

The methods may be substantially the same as those already illustrated in FIGS. 1 to 12 except for performing a damascene process for forming a wire. Thus, the same reference numerals will be used to refer to the same parts as those described in FIGS. 1 to 12. In addition, any repetitive explanation will be omitted.

Referring to FIG. 13, first structure 12a is formed on substrate 10 and photodiode 12 by processes substantially the same as those already illustrated in FIGS. 1 and 2. An etch stop layer pattern 30a is then formed on the first structure by the same processes as those already illustrated in FIGS. 3 and 4.

Second lower transparent insulation layer 32 is formed on etch stop layer pattern 30a and first upper opaque capping layer 28. Second lower transparent insulation layer 32 is etched so that a second contact hole (not shown) partially exposing first wire 26 may be formed. A second lower barrier metal material layer (not shown) may be formed on second lower transparent insulation layer 32 and an inner surface of the second contact hole.

A second lower copper layer (not shown) may be formed on the second lower barrier metal material layer. Thus, the second lower copper layer may fill up the second contact hole partially filled with the second lower barrier metal material layer.

The second lower copper layer and the second lower barrier metal material layer are then planarized by a planarization process such as a CMP process until second lower transparent insulation layer 32 is exposed. Thus, second lower barrier metal material layer pattern 80 and second contact 82 may be formed in the second contact hole. Particularly, the second lower barrier metal material layer and the second lower copper layer may be partially removed by the planarization process to form second lower barrier metal material layer pattern 80 and second contact 82.

Subsequently, second lower opaque capping layer 34 is formed on second lower barrier metal material layer pattern 80, second contact 82 and second lower transparent insulation layer 32.

Referring to FIG. 14, second upper transparent insulation layer 36 is formed on second lower opaque capping layer 34. Second upper transparent insulation layer 36 is then partially etched so that a second trench (not shown) exposing second contact 80 may be formed through second upper transparent insulation layer 36. A second upper barrier metal material layer may be continuously formed on second upper transparent insulation layer 36 and an inner surface of the second trench.

Thereafter, a portion of second upper barrier metal material layer, positioned directly over second contact 82, may be removed.

However, in some embodiments, the portion of the second upper barrier metal material layer, positioned directly over second contact 82, may not be removed.

A second upper copper layer (not shown) is formed on second upper transparent insulation layer 36 to fill up the second trench partially filled with the second upper barrier metal material layer.

The second upper copper layer and second upper barrier metal material layer are then planarized by a planarization process such as a CMP process until second upper transparent insulation layer 36 is exposed. Thus, second ancillary wire 86 and second upper barrier metal material layer pattern 84 may be formed in the second contact hole. That is, the second upper copper layer and the second upper barrier metal material layer are partially removed to form second ancillary wire 86 and second upper barrier metal material layer pattern 84, respectively.

Thereafter, second upper opaque capping layer 46 may be formed on second ancillary wire 86, second upper barrier metal material layer pattern 84 and second upper transparent insulation layer 36. Thus, lower structure 123b including second lower transparent insulation layer 32, second lower opaque capping layer 34, second upper transparent insulation layer 36, second upper opaque capping layer 46, second lower barrier metal material layer pattern 80, second contact 82, second upper barrier metal material layer pattern 84 and second ancillary wire 86 may be formed on first structure 12a.

Referring to FIG. 15, upper structure 124b including additional lower transparent insulation layer 48, additional lower opaque capping layer 50, additional upper transparent insulation layer 52, additional upper opaque capping layer 58, additional lower barrier metal material layer pattern 88, additional contact 90, additional upper barrier metal material layer pattern 92 and additional ancillary wire 94 may be formed on lower structure 123b by the same processes as those already illustrated in FIGS. 13 and 14.

Thus, second structure 13b including lower structure 123b and upper structure 124b may be formed on first structure 12a.

Thereafter, processes already illustrated in FIGS. 8 to 12 may be performed so that an image sensor as shown in FIG. 15 may be manufactured.

FIGS. 16 to 27 are cross-sectional views illustrating methods of manufacturing an image device in accordance with some other embodiments.

Figure 16:
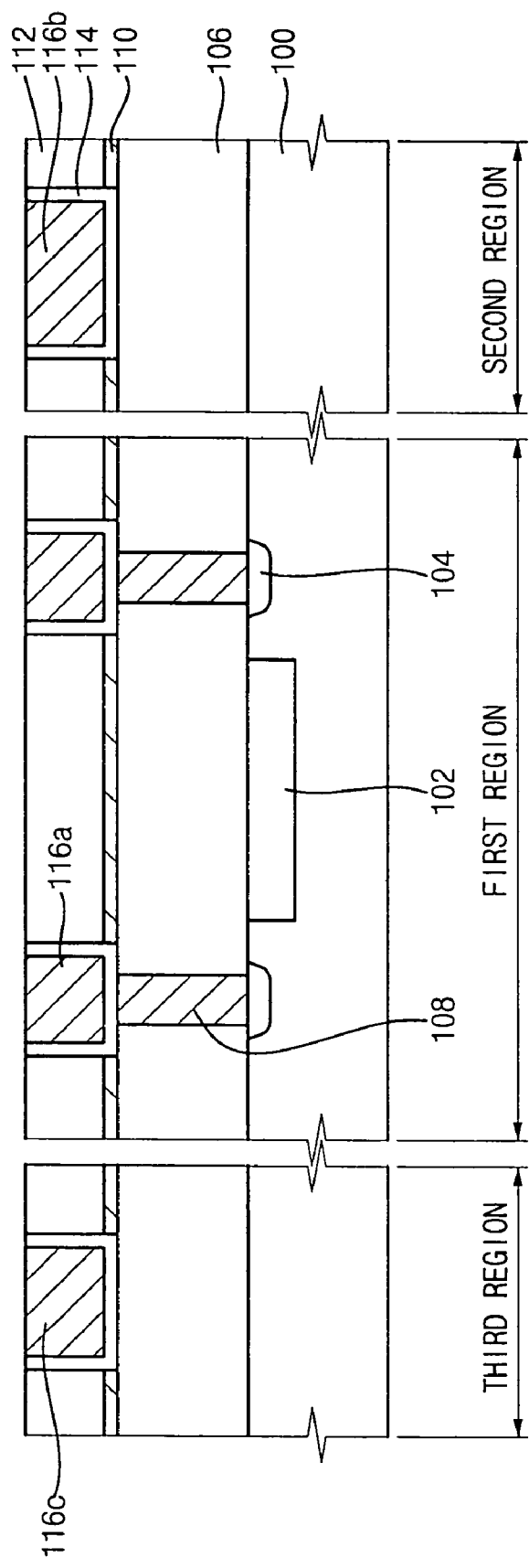
FIGS. 16 to 27 are cross-sectional views illustrating methods of manufacturing an image device in accordance with still other embodiments disclosed herein.

Referring to FIG. 16, substrate 100 including a first region, a second region and a third region is prepared. Active pixel sensors may be formed over the first region. A unit device such as a capacitor may be formed over the second region. Pad electrodes may be formed over the third region. The pad electrodes may be used for inputting signals into the active pixel sensors. The pad electrodes may be also used for outputting the signals from the active pixel sensors.

An isolation layer (not shown) may be formed in a surface of substrate 100 so that an isolation region and an active region may be defined. Photodiode 102 may be formed in a portion of the active region, the portion being positioned over the first region. Photodiode 102 may be exposed from the portion of the active region. In some embodiments, any other photo detector may be formed in the portion of the active region instead of photodiode 102. A transistor (not shown) may be formed over a portion of substrate 100, adjacent to photodiode 102. The transistor may be used as a switching device for photodiode 102.

A first lower transparent insulation layer 106 may be formed on substrate 100. First lower transparent insulation layer 106 may have a thickness of about 1,500 Å to about 3,000 Å. First lower transparent insulation layer 106 may be formed using a transparent material such as silicon oxide.

A photolithography process may be performed on first lower transparent insulation layer 106 so that a first contact hole (not shown) may be formed through first lower transparent insulation layer 106. The first contact hole may partially expose source/drain region 104 of the transistor or a gate electrode of the transistor. Here, the first contact hole may not be formed over photodiode 102. Thus, photodiode 102 still may be covered with first lower transparent insulation layer 106.

A first lower metal material layer (not shown) may be formed on first lower transparent insulation layer 106 to fill up the first contact hole. The first lower metal material layer may be formed using a metal such as titanium or tungsten. These materials may be used alone or in combination. The first lower metal material layer may be then planarized by a CMP process until first lower transparent insulation layer 106 is exposed so that first contact 108 may be formed in the first contact hole.

A first lower opaque capping layer 110 may be formed on first lower transparent insulation layer 106 and first contact 108. First lower opaque capping layer 110 may be used as an etch stop layer in etching first upper transparent insulation layer 112 subsequently formed on first lower opaque capping layer 110. Thus, first lower opaque capping layer 110 may have a substantially high etching selectivity with respect to first upper transparent insulation layer 112. For example, if first upper transparent insulation layer 112 includes silicon oxide, then first lower opaque capping layer 110 may include silicon nitride, silicon oxynitride or silicon carbide. These materials may be used alone or in combination. First lower opaque capping layer 110 may have a thickness of about 100 Å to about 1,000 Å.

First upper transparent insulation layer 112 is then formed on first lower opaque capping layer 110. First upper transparent insulation layer 112 may be formed using a transparent material such as silicon oxide.

First upper transparent insulation layer 112 and first lower opaque capping layer 110 are subsequently etched so that first trenches (not shown) may be formed through first upper transparent insulation layer 112 and first lower opaque capping layer 110. The first trenches may be positioned over the first region, the second region and the third region.

The first trench formed over the first region may expose first contact 108. In particular, the first trench formed over the first region may not be positioned directly over photodiode 102. A position of the first trench formed over the second region may correspond to that of a capacitor lower electrode. A position of the first trench formed over the third region may correspond to that of a first lower conductive pattern electrically connected to the pad electrode.

Thereafter, a first barrier metal material layer (not shown) may be continuously formed on first upper transparent insulation layer 112 and an inner surface of the first trench. The first barrier metal material layer may prevent copper included in a first copper layer that is subsequently formed on the first barrier metal material layer from being easily diffused into first upper transparent insulation layer 112. The first barrier metal material layer may be formed using a metal material such as titanium, titanium nitride, tantalum or tantalum nitride. These may be used alone or in combination.

In some embodiments, the first barrier metal material layer may be a single-layered structure. Alternatively, the first barrier metal material layer may be a multi-layered structure including at least two layers that include different materials.

The first copper layer (not shown) may be formed on first upper transparent insulation layer 112 to fill up the first trench that partially filled with the first barrier metal material layer.

The first copper layer may be formed by an electroplating process. The electroplating process may be performed after a copper seed is formed on the first barrier metal material layer by a sputtering process. Alternatively, the first copper layer may be formed by a non-electrolytic plating process.

The first copper layer and the first barrier metal material layer may be then planarized by a CMP process until first upper transparent insulation layer 112 is exposed so that first ancillary wire 116a, capacitor lower electrode 116b, first lower conductive pattern 116c and first barrier metal material layer pattern 114 may be formed.

In particular, an upper portion of the first copper layer may be removed by the CMP process so that first ancillary wire 116a, capacitor lower electrode 116b and first lower conductive pattern 116c are formed.

First ancillary wire 116a is formed in the first trench formed over the first region so that first ancillary wire 116a may be electrically connected to first contact 108. Thus, a first wire including first contact 108 and first ancillary wire 116a may be formed over the first region. First ancillary wire 116a may have a line shape.

Capacitor lower electrode 116b is formed in the first trench formed over the second region. First lower conductive pattern 116c may be formed in the first trench formed over the third region. An upper portion of the first barrier metal material layer may be then removed by the CMP process so that first barrier metal material layer pattern 114 may be formed on the inner surface of the first trench.

A conductive structure including first contact 108 and first ancillary wire 116a that are positioned over the first region is hereinafter referred to as the first wire.

Figure 17:
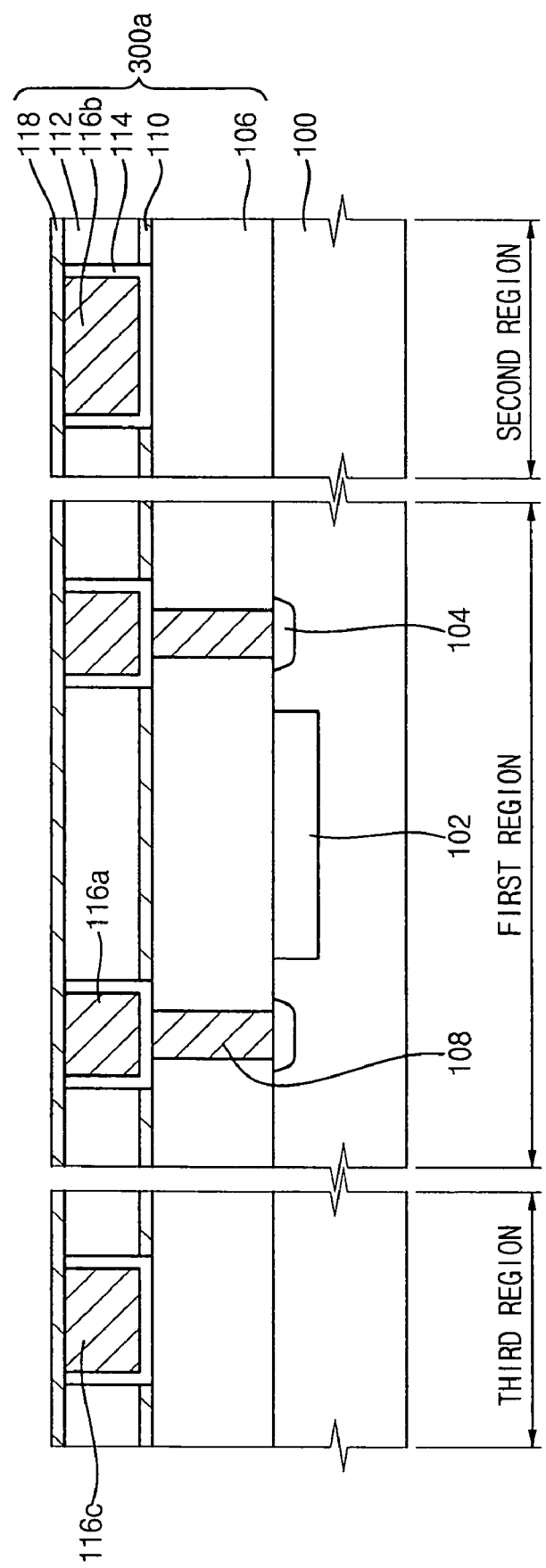

Referring to FIG. 17, first upper opaque capping layer 118 is then formed on first ancillary wire 116a, capacitor lower electrode 116b, first lower conductive pattern 116c and first upper transparent insulation layer 112. A portion of first upper opaque capping layer 118, positioned over the second region, may be used as a capacitor dielectric layer. First upper opaque capping layer 118 may be formed using silicon nitride, silicon oxynitride or silicon carbide. These materials may be used alone or in combination. First upper opaque capping layer 118 may have a thickness of about 100 Å to about 1,000 Å.

A first structure 300a including first lower transparent insulation layer 106, first lower opaque capping layer 110, first barrier metal material layer pattern 114, first ancillary wire 116a, capacitor lower electrode 116b, first lower conductive pattern 116c, first upper transparent insulation layer 112 and first upper opaque capping layer 118 may be formed on substrate 100.

Figure 18:
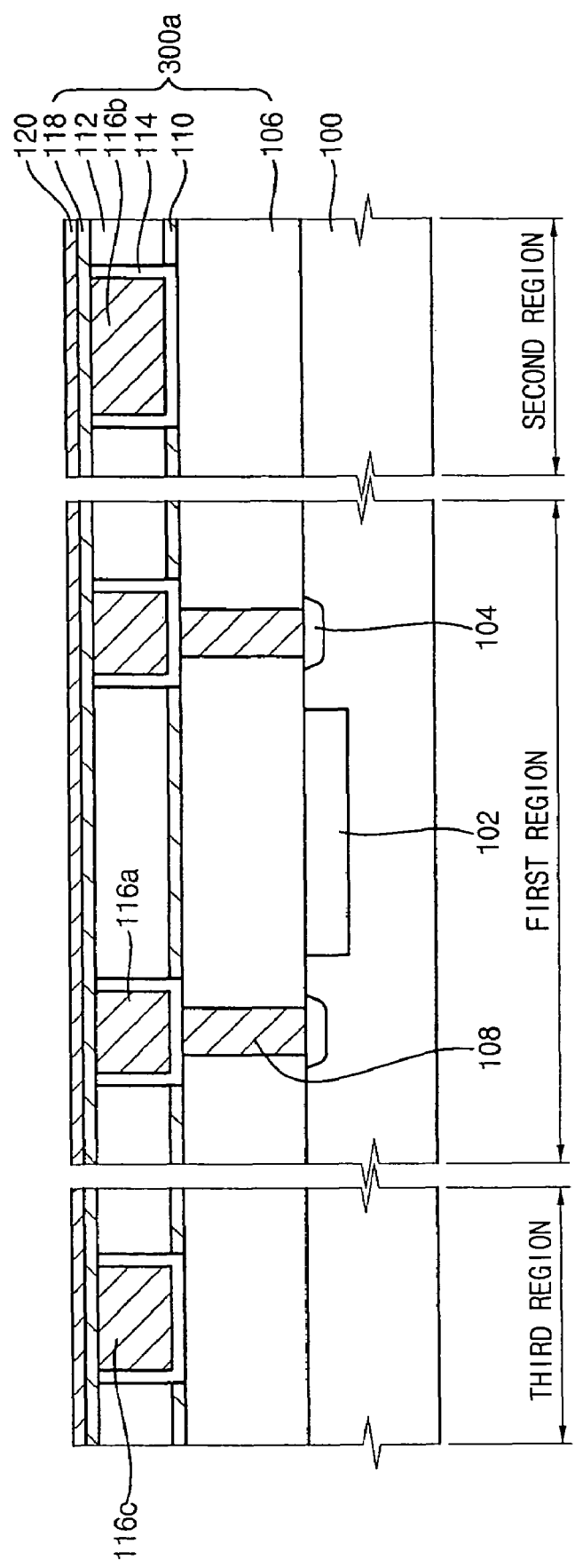

Referring to FIG. 18, metal material layer 120 is then formed on first upper opaque capping layer 118. A portion of metal material layer 120, positioned over the first region, may be used as etch stop layer pattern 120a (see FIG. 19). A portion of metal material layer 120, positioned over the second region, may be used as capacitor upper electrode 120b (see FIG. 19). Metal material layer 120 may be formed using a metal material such as titanium, tantalum, titanium nitride or tantalum nitride. These metal materials may be used alone or in combination. Metal material layer 120 may be a single-layered structure. Alternatively, metal material layer 120 may be a multi-layered structure including at least two layers that include different metal materials.

Figure 19:
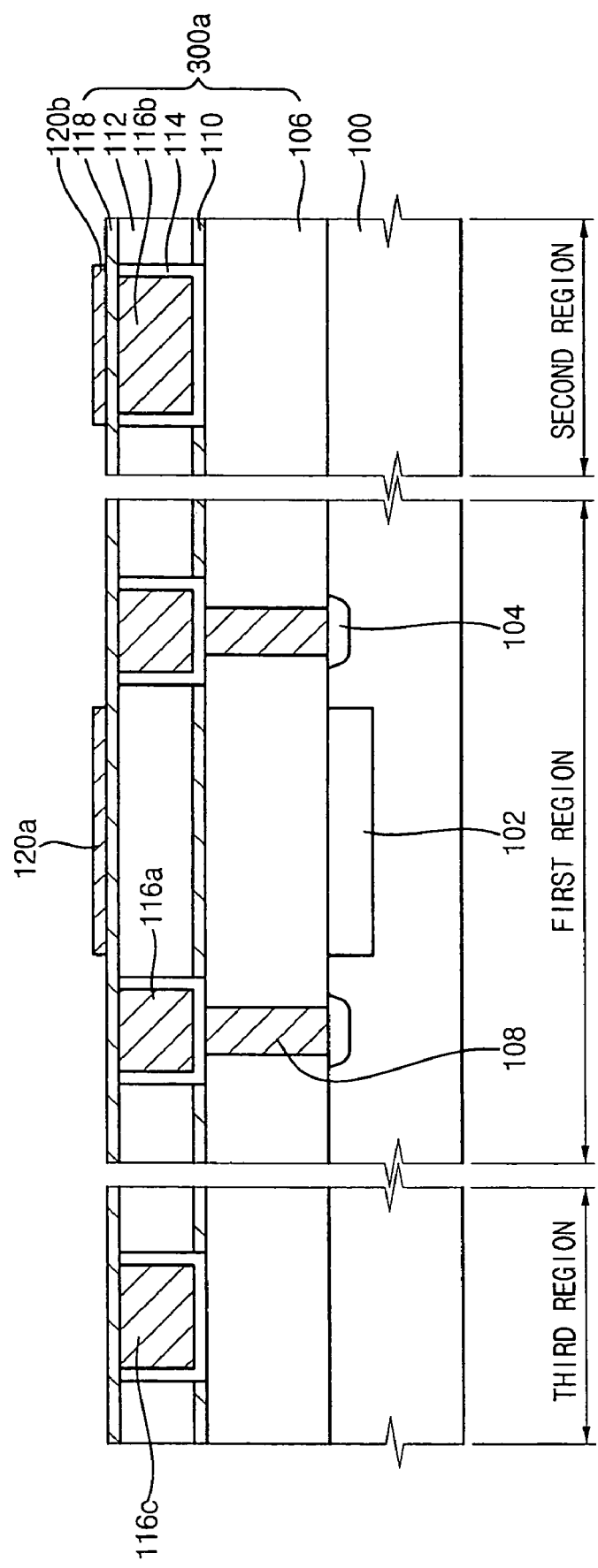

Referring to FIG. 19, metal material layer 120 is partially etched so that etch stop layer pattern 120a and capacitor upper electrode 120b may be formed.

As described above, etch stop layer pattern 120a may be positioned over the first region. In particular, etch stop layer pattern 120a may be positioned directly over photodiode 102. Capacitor upper electrode 120b may be positioned over the second region. In particular, capacitor upper electrode 120b may be positioned directly over capacitor lower electrode 116b.

An etching process subsequently performed to form first preliminary opening 156 (see FIG. 24) may be stopped by etch stop layer pattern 120a. Thus, etch stop layer pattern 120a may be positioned over photodiode 102. In addition, a width of etch stop layer pattern 120a may be substantially wider than that of first preliminary opening 156.

If etch stop layer pattern 120a is positioned over first ancillary wire 116a, an electrical short may be unfortunately generated. Thus, etch stop layer pattern 120a may not be positioned over first ancillary wire 116a.

Because etch stop layer pattern 120a and capacitor upper electrode 120b may be formed by patterning metal material layer 120, etch stop layer pattern 120a may be formed simultaneously with capacitor upper electrode 120b by a photolithography process. That is, etch stop layer pattern 120a and capacitor upper electrode 120b may be simultaneously formed by performing the photolithography process once without performing additional photolithography processes.

Figure 20:
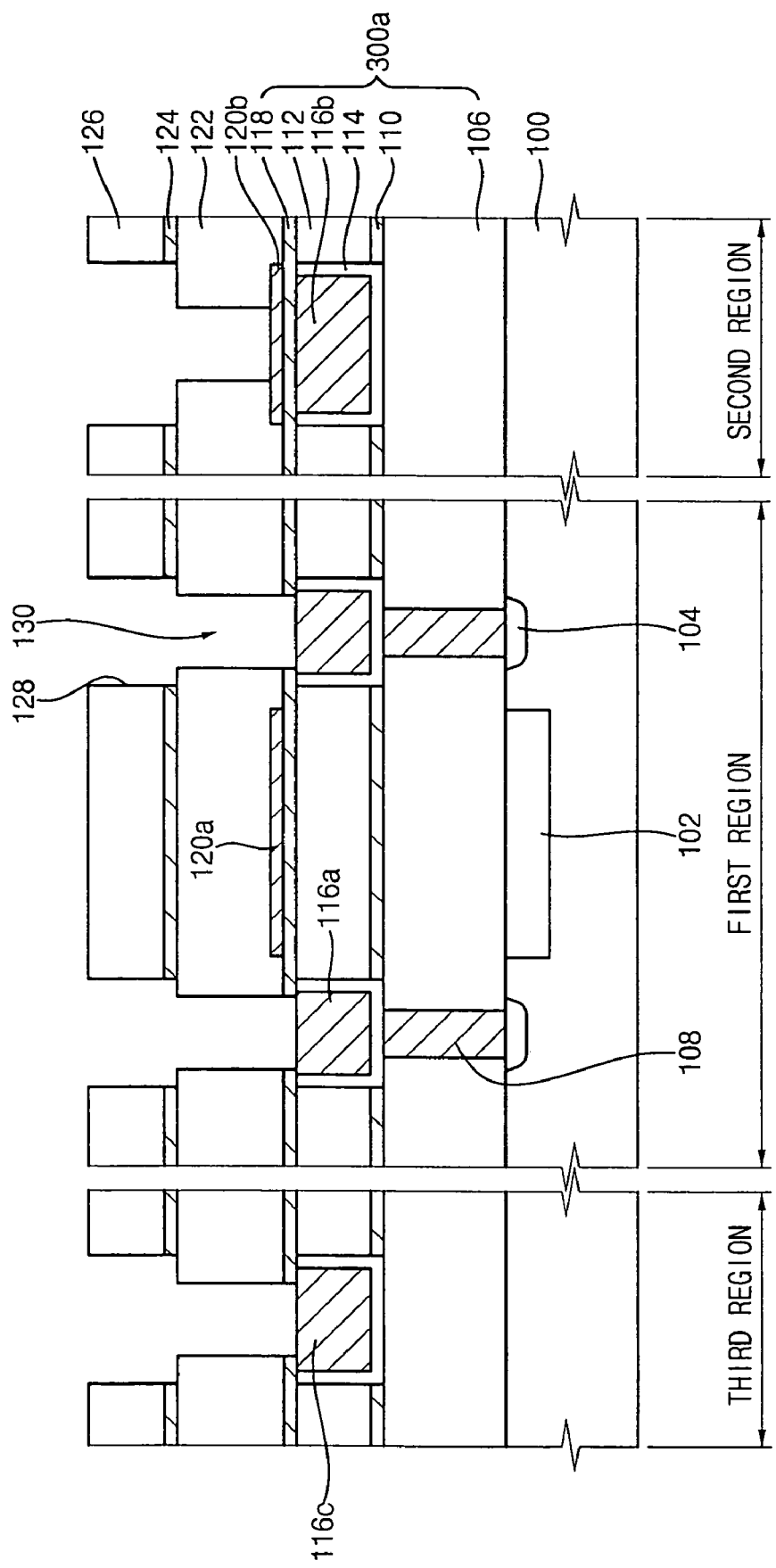

Referring to FIG. 20, second lower transparent insulation layer 122 is formed on etch stop layer pattern 120a, capacitor upper electrode 120b and first upper opaque capping layer 118. Second lower transparent insulation layer 122 may be formed using a transparent material such as silicon oxide. Second lower transparent insulation layer 122 may have a thickness of about 1,000 Å to about 3,000 Å.

A second lower opaque capping layer 124 is then formed on second lower transparent insulation layer 122. Second lower opaque capping layer 124 may be formed using silicon nitride, silicon oxynitride or silicon carbide. These materials may be used alone or in combination. A thickness of second lower opaque capping layer 124 may be about 100 Å to about 1,000 Å.

A second upper transparent insulation layer 126 may be formed on second lower opaque capping layer 124. Second upper transparent insulation layer 126 may be formed using the same material as that included in second lower transparent insulation layer 122.

Second upper transparent insulation layer 126, second lower opaque capping layer 124 and second lower transparent insulation layer 122 are partially etched so that second contact holes 130 may be formed through second lower transparent insulation layer 122. In particular, second contact hole 130 formed over the first region may expose first ancillary wire 116a second contact hole 130 formed over the second region may expose capacitor upper electrode 120b. second contact hole 130 formed over the third region may expose first lower conductive pattern 116c.

Second upper transparent insulation layer 126 is partially etched so that second trench 128 may be formed. Second trench 128 is positioned over second contact hole 130 so that second trench 128 may be communicated with second contact hole 130. That is, second trench 128 is disposed adjacent and beneath second contact hole 130.

Figure 21:
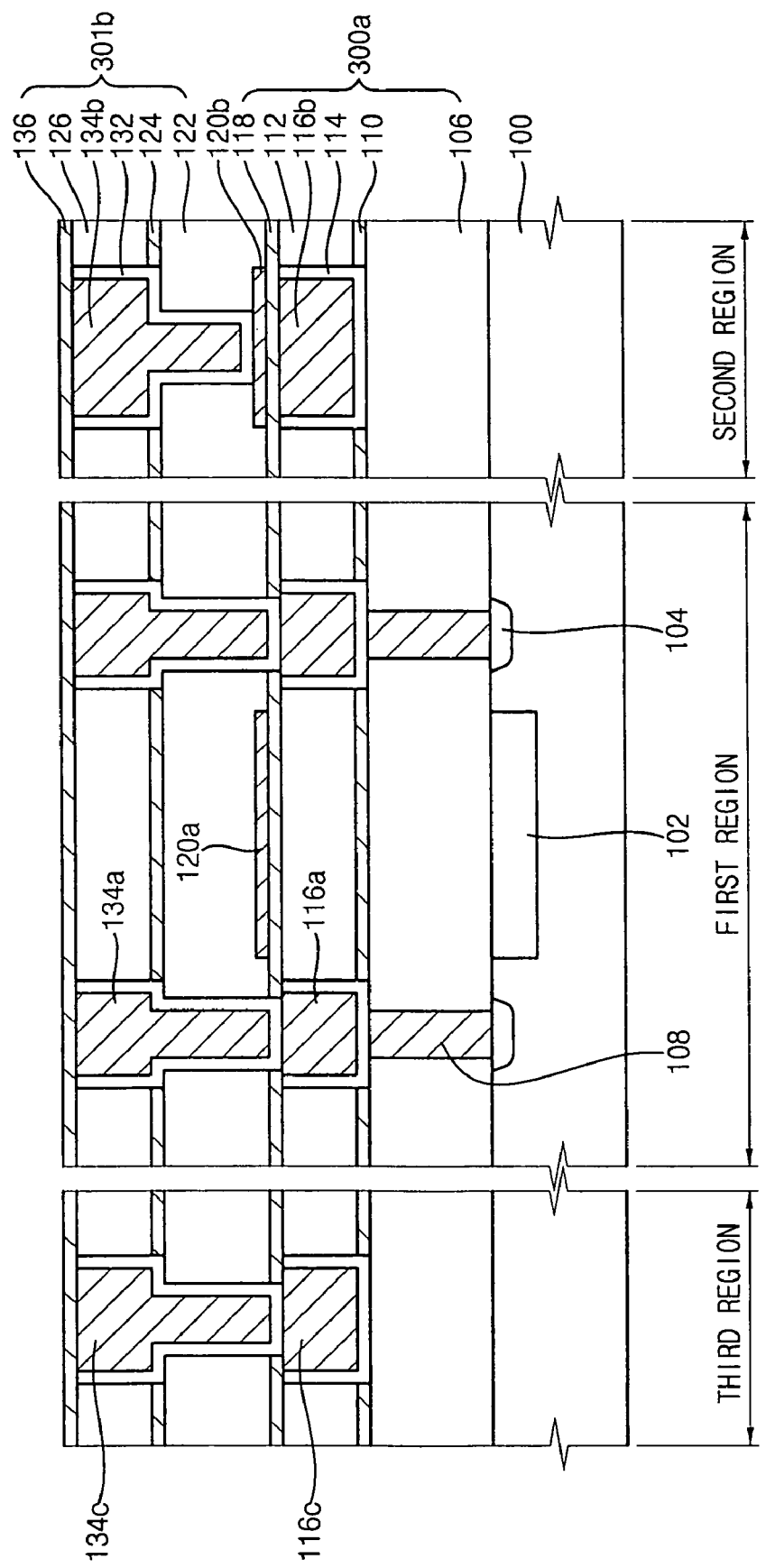

Referring to FIG. 21, a second barrier metal material layer (not shown) may be continuously formed on second upper transparent insulation layer 126, an inner surface of second trench 128 and an inner surface of second contact hole 130. The second barrier metal layer may have a substantially uniform thickness.

Thereafter, a second copper layer (not shown) is formed on second barrier metal material layer to fill up second trench 128 and second contact hole 130 that are partially filled with the second barrier metal material layer.

The second copper layer and the second barrier metal material layer are then planarized by a CMP process until second upper transparent insulation layer 126 is exposed so that second wire 134a, first logic wire 134b, first pad wire 134c and second barrier metal material layer pattern 132 may be formed.

In particular, an upper portion of the second copper layer is removed by the CMP process so that second wire 134a, first logic wire 134b and first pad wire 134c may be formed. Second wire 134a is formed over the first region so that second wire 134a may be electrically connected to first ancillary wire 116a. First logic wire 134b is formed over the second region so that first logic wire 134b may be electrically connected to capacitor upper electrode 120b. First pad wire 134c is formed over the third region so that first pad wire 134c may be electrically connected to first lower conductive pattern 116c. An upper portion of the second barrier metal material layer is removed by the CMP process so that second barrier metal material layer pattern 132 may be formed.

Thereafter, second upper opaque capping layer 136 is formed on second wire 134a, first logic wire 134b, first pad wire 134c and second upper transparent insulation layer 126. Second upper opaque capping layer 136 may be formed using silicon nitride, silicon oxynitride or silicon carbide. These materials may be used alone or in combination.

As a result, lower structure 301b including second lower transparent insulation layer 122, second lower opaque capping layer 124, second upper transparent insulation layer 126, second barrier metal material layer pattern 132, second wire 134a, first logic wire 134b, first pad wire 134c and second upper opaque capping layer 136 is formed on first structure 300a.

Figure 22:
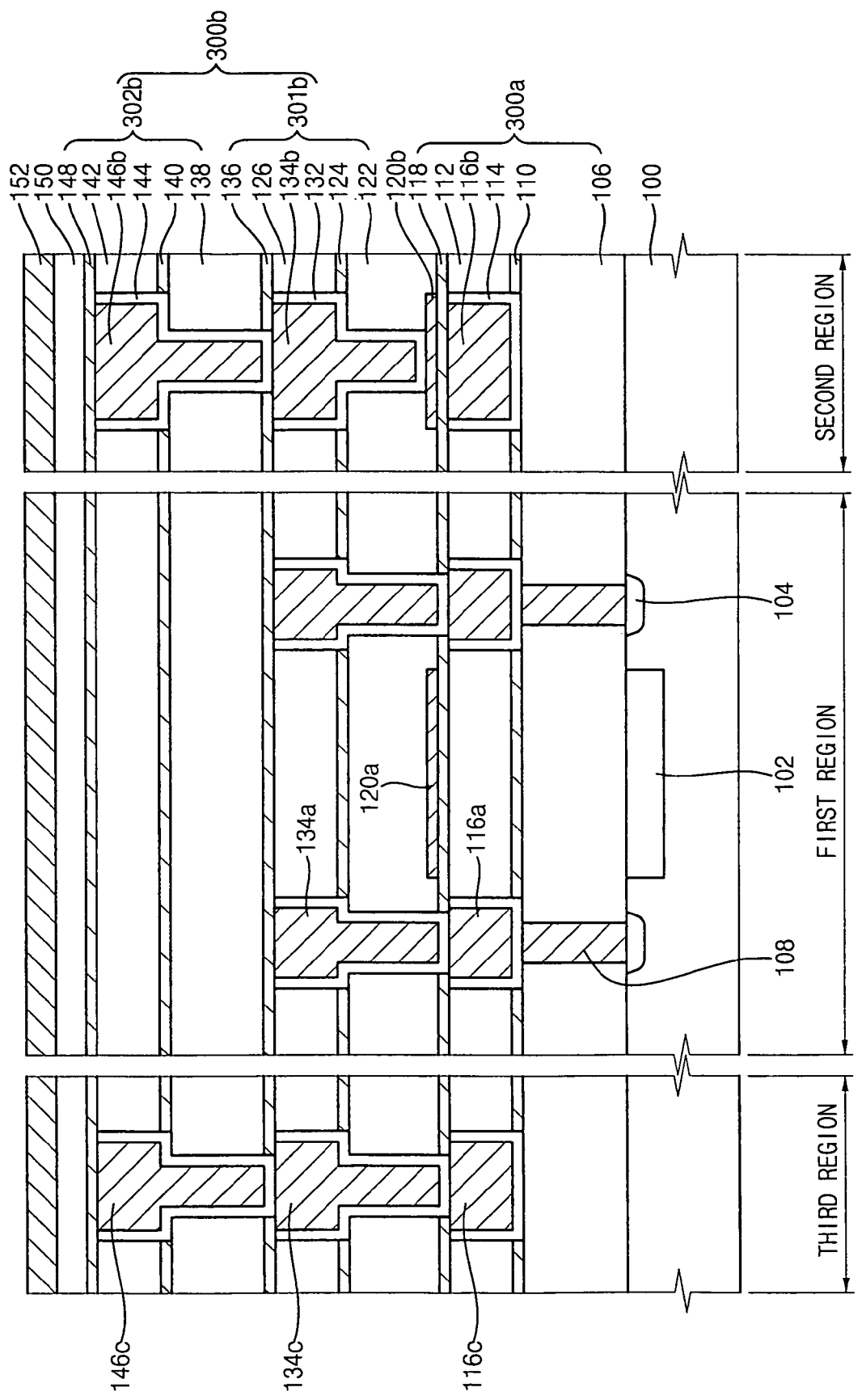

Referring to FIG. 22, upper structure 302b may be formed on lower structure 301b by the same processes as those already illustrated in FIGS. 20 and 21. Upper structure 302b may include additional lower transparent insulation layer 138, additional lower opaque capping layer 140, additional upper transparent insulation layer 142, additional barrier metal material layer pattern 144, additional logic wire 146b, additional pad wire 146c and additional opaque capping layer 148.

Additional logic wire 146b and additional pad wire 146c may be formed through second upper opaque capping layer 136, additional lower transparent insulation layer 138, additional lower opaque capping layer 140 and additional upper transparent insulation layer 142. Additional logic wire 146b may be electrically connected to first logic wire 134b. Additional pad wire 146c may be electrically connected to first pad wire 134c.

In some embodiments, a third wire may be further formed through second upper opaque capping layer 136, additional lower transparent insulation layer 138, additional lower opaque capping layer 140 and additional upper transparent insulation layer 142. The third wire may be electrically connected to second wire 134a.

In some embodiments, processes for forming upper structure 302b may be performed two (or more) times so that second structure 300b may include two (or more) upper structures 302b.

A first protection layer 150 and second protection layer 152 may be successively formed on additional opaque capping layer 148. First protection layer 150 and second protection layer 152 may protect second structure 300b, etch stop layer pattern 120a, capacitor upper electrode 120b and first structure 300a. First protection layer 150 and second protection layer 152 may be formed by the same processes as those already illustrated in FIG. 9. Thus, any further explanation will be omitted.

Figure 23:
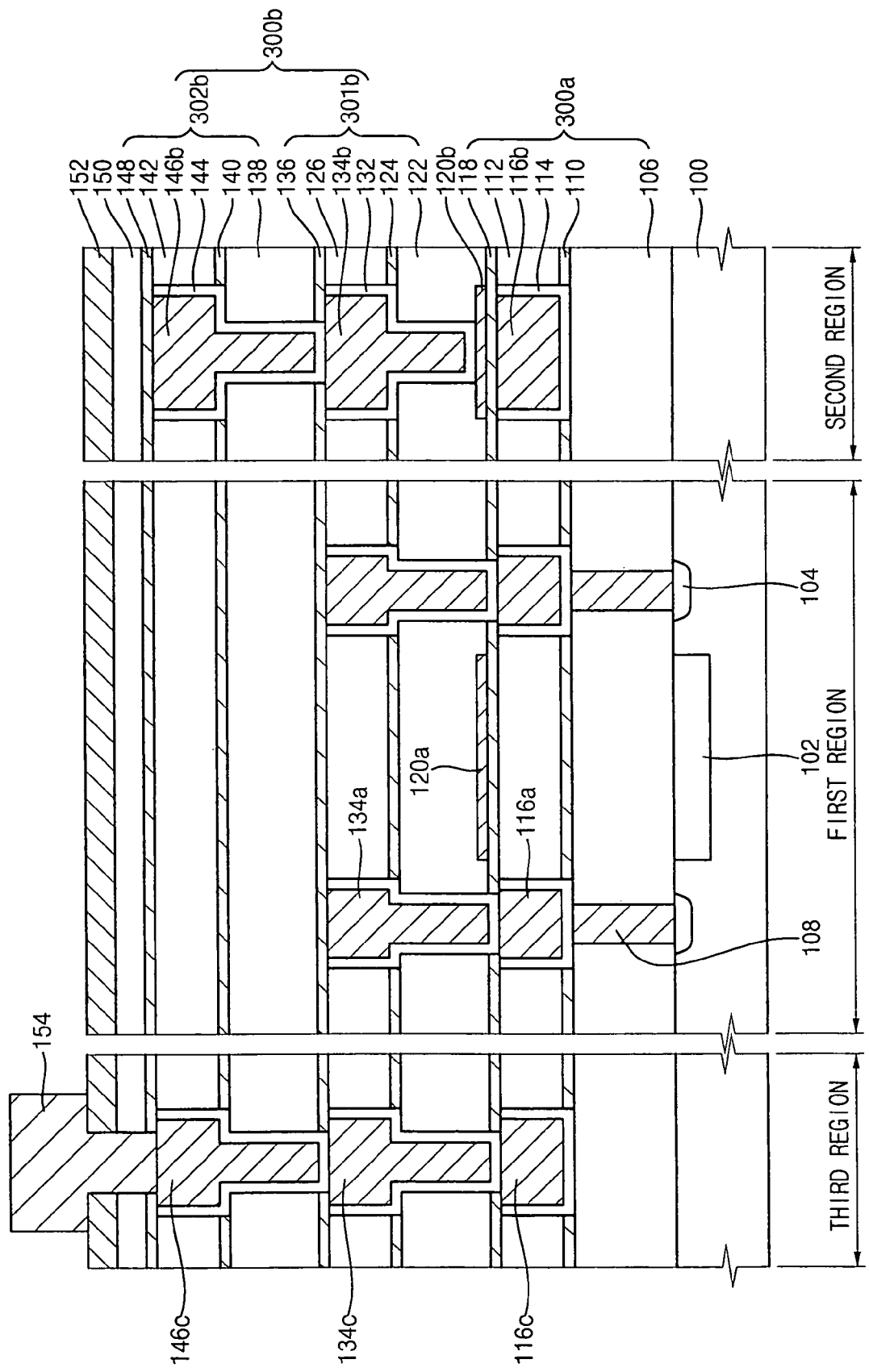

Referring to FIG. 23, second protection layer 152, first protection layer 150 and additional opaque capping layer 148 are partially etched so that a via hole (not shown) partially exposing additional pad wire 146c may be formed through second protection layer 152, first protection layer 150 and additional opaque capping layer 148. A pad metal material layer (not shown) may be formed on second protection layer 152 to fill up the via hole. The pad metal material layer may be formed using aluminum. The pad metal material layer may have a thickness of about 5,000 Å to about 10,000 Å. The pad metal material layer is then patterned to form pad electrode 154. A wire may be electrically connected to pad electrode 154 in a packaging process.

Figure 24:
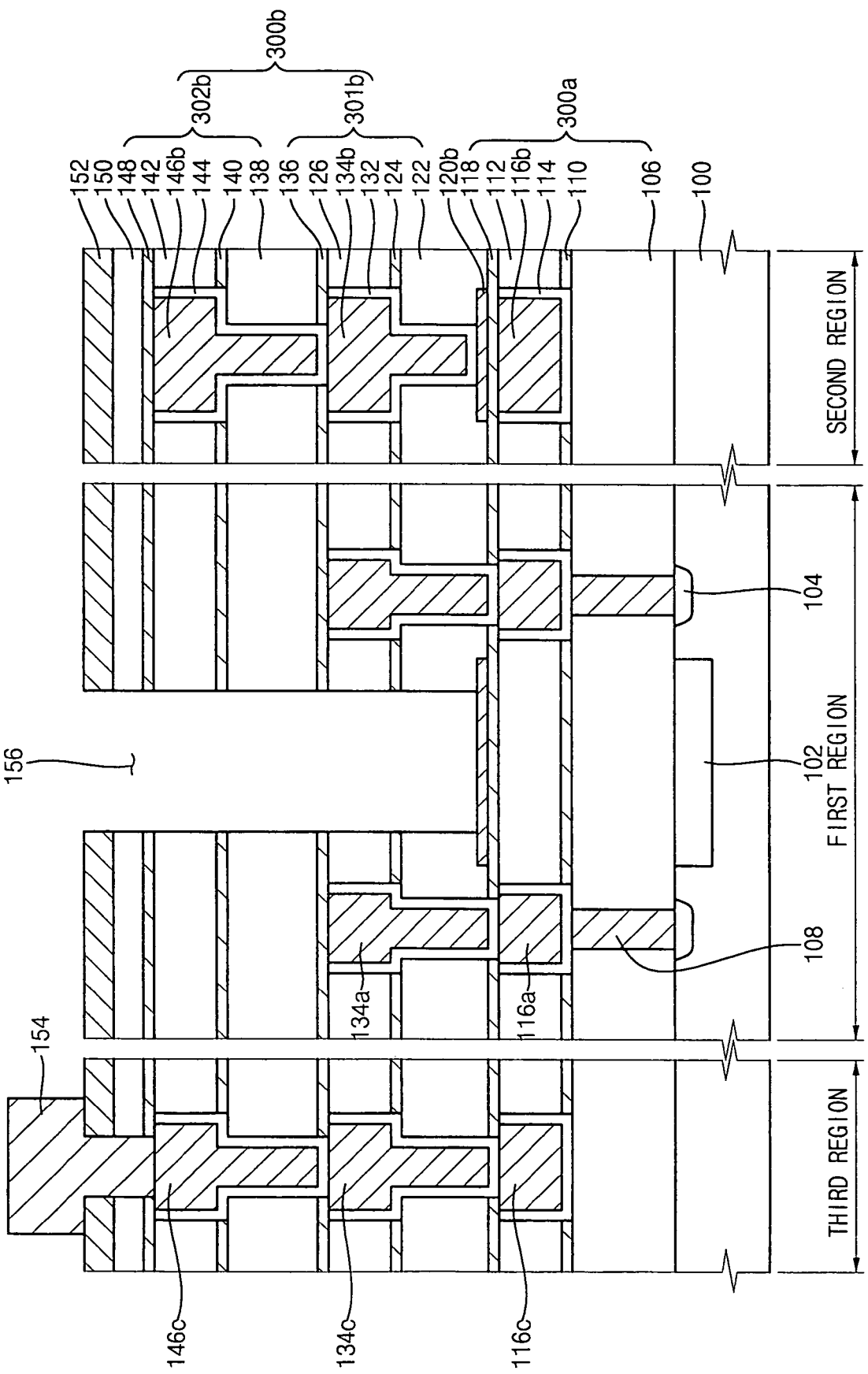

Referring to FIG. 24, a photoresist pattern (not shown) is formed on pad electrode 154 and second protection layer 152. The photoresist pattern may have an opening positioned directly over photodiode 102. Second protection layer 152, first protection layer 150 and second structure 300b are successively etched by using the photoresist pattern as an etch mask. Thus, first preliminary opening 156 exposing etch stop layer pattern 120a may be formed through second protection layer 152, first protection layer 150 and second structure 300b.

Figure 25:
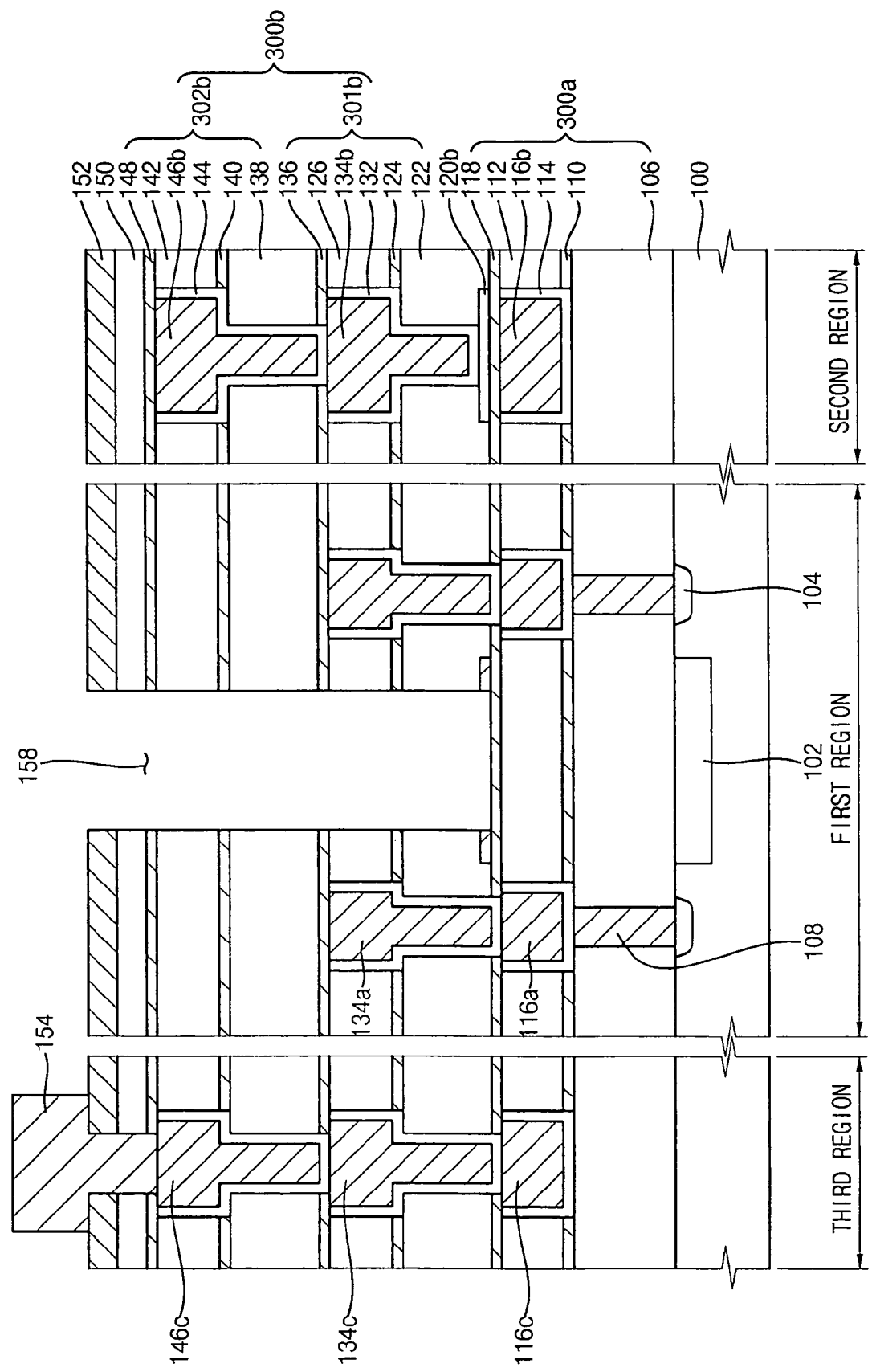

Referring to FIG. 25, etch stop layer pattern 120a is then etched so that second preliminary opening 158 is formed. In particular, a portion of etch stop layer pattern 120a exposed through first preliminary opening 156 is removed to form second preliminary opening 158. Second preliminary opening 158 may expose first upper opaque capping layer 118.

Figure 26:
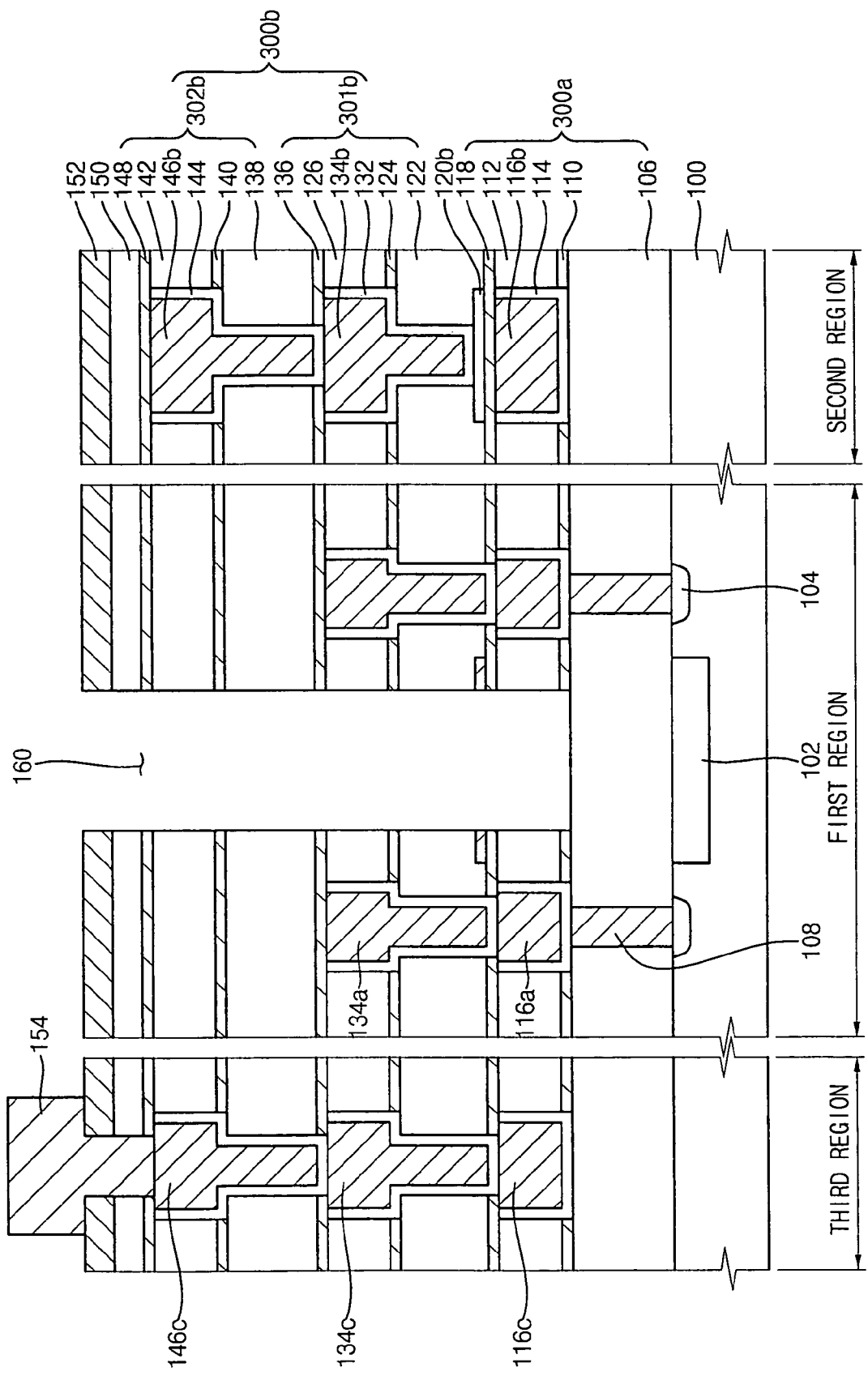

Referring to FIG. 26, first upper opaque capping layer 118, first upper transparent insulation layer 112 and first lower opaque capping layer 110 are successively etched so that opening 160 partially exposing first lower transparent insulation layer 106 may be formed.

Figure 27:
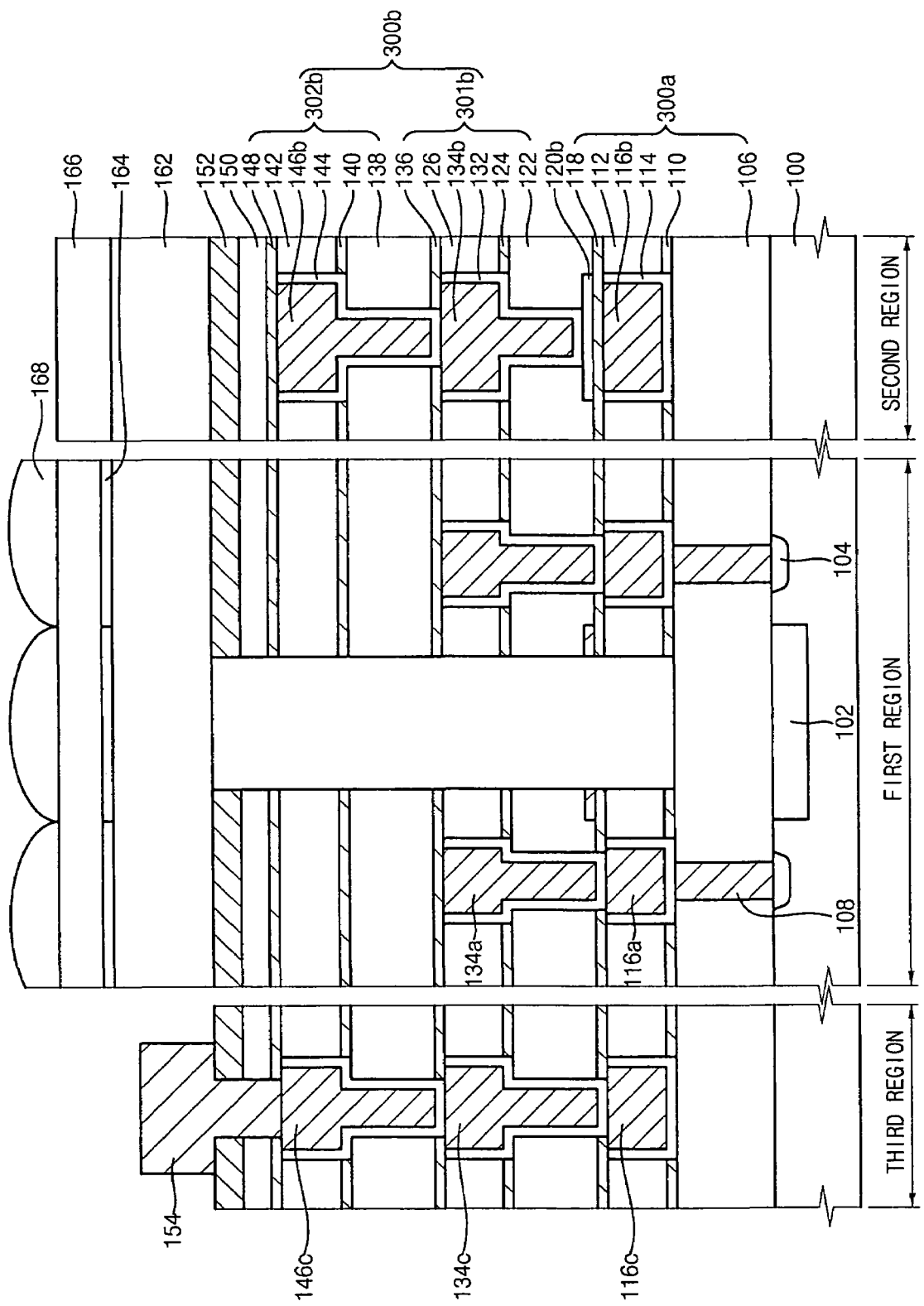

Referring to FIG. 27, first uppermost insulation layer 162 is formed on second protection layer 152 to fill up opening 160. First uppermost insulation layer 162 may be formed using a transparent material. First uppermost insulation layer 162 may then be planarized. Thereafter, color filter 164 may be formed on first uppermost insulation layer 162. Color filter 164 may include a red color filter portion, a green color filter portion and a blue color filter portion.

A second uppermost transparent insulation layer 166 is formed on color filter 164 micro lens 168 is then formed on second uppermost transparent insulation layer 166. Micro lens 168 may concentrate light on photodiode 102. Micro lens 168 may have a substantially hemispherical shape.

Thereafter, first uppermost transparent insulation layer 162 and second uppermost transparent insulation layer 164 are partially etched so that pad electrode 154 may be exposed. Thus, an image device such as a CMOS image sensor may be manufactured.

As described above, etch stop layer pattern 120a and capacitor upper electrode 120b may be simultaneously formed by performing the photolithography process once without performing additional photolithography processes. Thus, a cost required for forming etch stop layer pattern 120a may be reduced.

In accordance with the present invention, a photodiode may be hardly damaged in manufacturing an image device. In addition, a decrease in light transmittance due to a residual portion of opaque material may be efficiently prevented. Thus, electrical characteristics and reliability of the image device may be increased.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing an image device, comprising:
   forming a first structure on a substrate having a photodiode, the first structure including an opaque upper portion and a transparent lower portion;
   forming an etch stop layer pattern on the first structure, the etch stop layer pattern being positioned over the photodiode;
   forming a second structure on the first structure to cover the etch stop layer pattern, the second structure having at least one opaque capping layer; and
   forming an opening over the photodiode by etching the second structure, the etch stop layer pattern and the opaque upper portion of the first structure, the opening exposing the transparent lower portion of the first structure.

2. The method of claim 1, wherein forming the opening comprises:
   forming a first preliminary opening through the second structure by etching the second structure, the first preliminary opening exposing a portion of the etch stop layer pattern;
   forming a second preliminary opening through the second structure and the etch stop layer pattern by etching the portion of the etch stop layer pattern, the second preliminary opening partially exposing the opaque upper portion of the first structure; and
   etching the opaque upper portion of the first structure to form the opening through the second structure, the etch stop layer pattern and the opaque upper portion of the first structure.

3. The method of claim 1, wherein forming the first structure comprises:
   forming a first lower transparent insulation layer on the substrate including the photodiode;
   forming a first lower opaque capping layer on the first lower transparent insulation layer;
   forming a first upper transparent insulation layer on the first lower opaque capping layer; and
   forming a first upper opaque capping layer on the first upper transparent insulation layer.

4. The method of claim 3, wherein etching the opaque upper portion of the first structure comprises:
   successively etching the first upper opaque capping layer and the first upper transparent insulation layer; and
   etching the first lower opaque capping layer until the first lower transparent insulation layer is exposed.

5. The method of claim 3, wherein the first lower transparent insulation layer has a thickness of about 300Å to about 2,500Å, and the first upper transparent insulation layer has a thickness of about 300Å to about 2,500Å.

6. The method of claim 3, further comprising forming a first wire through the first upper opaque capping layer, the first upper transparent insulation layer, the first lower opaque capping layer and the first lower transparent insulation layer, the first wire including a first contact and a first ancillary wire, the first contact being electrically connected to a contact region of the substrate, the first ancillary wire being formed on the first contact to be electrically connected to the first contact.

7. The method of claim 6, wherein the first wire is not positioned directly over the photodiode.

8. The method of claim 1, wherein forming the first structure comprises:
   forming a first lower transparent insulation layer on the substrate, the first lower transparent insulation layer including a first contact electrically connected to a contact region of the substrate;
   forming a first lower opaque capping layer and a first upper transparent insulation layer on the first lower transparent insulation layer, the first lower opaque capping layer being capable of preventing a metal diffusion;
   etching the first upper transparent insulation layer and the first lower opaque capping layer to form a first trench through the first upper transparent insulation layer and the first lower opaque capping layer, the first trench exposing the first contact;
   forming a first ancillary wire including metal in the first trench; and
   forming a first upper opaque capping layer on the first ancillary wire and the first upper transparent insulation layer.

9. The method of claim 1, further comprising forming the second structure at least twice.

10. The method of claim 1, wherein forming the second structure comprises:
    forming a second wire including a second contact and a second ancillary wire, the second contact being electrically connected to a contact region of the substrate, the second ancillary wire being positioned on the second contact to be electrically connected to the second contact; and
    forming an additional wire on the second wire, the additional wire including an additional contact and an additional ancillary wire, the additional contact being electrically connected to the second contact, the additional ancillary wire being positioned on the additional contact to be electrically connected to the additional contact.

11. The method of claim 10, further comprising forming the additional wire at least twice.

12. The method of claim 10, wherein the second wire and the additional wire each include copper.

13. The method of claim 10, wherein the second wire and the additional wire are not positioned over the photodiode.

14. The method of claim 10, wherein forming the second wire comprises:
    forming a second lower transparent insulation layer on the first structure to cover the etch stop layer pattern;
    forming a second lower opaque capping layer and a second upper transparent insulation layer on the second lower transparent insulation layer, the second lower opaque capping layer being capable of preventing a metal diffusion;
    etching the second upper transparent insulation layer, the second lower opaque capping layer and the second lower transparent insulation layer to form a second trench and a second contact hole, the second trench being formed through the second upper transparent insulation layer and the second lower opaque capping layer, the second contact hole being formed through the second lower transparent insulation layer, the second contact hole being adjacent to and disposed beneath with the second trench;

forming the second contact and the second ancillary wire respectively in the second contact hole and the second trench, the second contact and the second ancillary wire including metal; and forming a second upper opaque capping layer on the second ancillary wire and the second upper transparent insulation layer.

15. The method of claim 10, wherein forming the second wire comprises:

forming a second lower transparent insulation layer including the second contact on the first structure;

forming a second lower opaque capping layer and a second upper transparent insulation layer on the second lower transparent insulation layer, the second lower opaque capping layer being capable of preventing a metal diffusion;

etching the second upper transparent insulation layer and the second lower opaque capping layer to form a second trench partially exposing the second contact;

forming the second ancillary wire including metal in the second trench; and forming a second upper opaque capping layer on the second ancillary wire and the second upper transparent insulation layer.

16. The method of claim 1, wherein the etch stop layer pattern includes a metal material.

17. The method of claim 16, wherein the metal material is at least one material selected from the group consisting of titanium, tantalum, titanium nitride and tantalum nitride.

18. The method of claim 1, wherein the opaque capping layer includes any one material selected from the group consisting of silicon nitride and silicon carbide.

19. The method of claim 1, further comprising:

forming a protection structure on the second structure to protect the second structure, the etch stop layer pattern and the first structure; etching the protection structure to form a pad contact hole through the protection structure; and forming a pad including a conductive material in the pad contact hole.

20. The method of claim 19, wherein the protection structure includes a first protection layer, and a second protection layer that is formed on the first protection layer.

21. The method of claim 20, wherein the first protection layer includes silicon oxide, and the second protection layer includes at least one material selected from the group consisting of silicon nitride and silicon carbide.

22. The method of claim 20, wherein the first protection layer has a thickness of about 100Å to about 5,000Å, and the second protection layer has a thickness of about 100Å to about 5,000Å.

23. The method of claim 1, further comprising:

forming a transparent insulation layer on the second structure to fill up the opening;

forming a color filter on the transparent insulation layer; and forming a micro lens on the color filter.

24. A method of manufacturing an image device, the method comprising:

forming a photodiode in a first region of a substrate including the first region and a second region;

forming a first structure on the substrate, the first structure including an opaque upper portion and a transparent lower portion, the first structure including a wire and a capacitor lower electrode that are formed through the first structure, the wire being formed over the first region, the wire not being positioned over the photodiode, the capacitor lower electrode being formed over the second region;

forming a dielectric layer on the first structure, the wire and the capacitor lower electrode;

forming an etch stop layer pattern and a capacitor upper electrode on the dielectric layer, the etch stop layer pattern being positioned over the photodiode, the capacitor upper electrode being positioned over the capacitor lower electrode;

forming a second structure including at least one opaque capping layer on the etch stop layer pattern and the first structure; and forming an opening over the photodiode by etching the second structure, the etch stop layer pattern and the opaque upper portion of the first structure, the opening exposing the transparent lower portion of the first structure.

25. The method of claim 24, wherein forming the opening comprises:

forming a first preliminary opening through the second structure by etching the second structure, the first preliminary opening exposing a portion of the etch stop layer pattern;

forming a second preliminary opening through the second structure and the etch stop layer pattern by etching the portion of the etch stop layer pattern, the second preliminary opening partially exposing the opaque upper portion of the first structure; and etching the opaque upper portion of the first structure to form the opening through the second structure, the etch stop layer pattern and the opaque upper portion of the first structure.

26. The method of claim 24, wherein forming the first structure comprises:

forming a first lower transparent insulation layer on the substrate including the photodiode;

forming a first lower opaque capping layer on the first lower transparent insulation layer;

forming a first upper transparent insulation layer on the first lower opaque capping layer; and forming a first upper opaque capping layer on the first upper transparent insulation layer.

27. The method of claim 26, wherein etching the opaque upper portion of the first structure comprises:

successively etching the first upper opaque capping layer and the first upper transparent insulation layer; and etching the first lower opaque capping layer until the first lower transparent insulation layer is exposed.

28. The method of claim 27, wherein the first wire and the capacitor lower electrode include copper.

29. The method of claim 24, wherein forming the first structure comprises:

forming a first lower transparent insulation layer on the substrate, the first lower transparent insulation layer including a first contact electrically connected to a contact region of the substrate;

forming a first lower opaque capping layer and a first upper transparent insulation layer on the first lower transparent insulation layer, the first lower opaque capping layer being capable of preventing a metal diffusion;

etching the first upper transparent insulation layer and the first lower opaque capping layer to form a first trench through the first upper transparent insulation layer and the first lower opaque capping layer, the first trench exposing the first contact;

forming a first ancillary wire including metal in the first trench; and forming a first upper opaque capping layer on the first ancillary wire and the first upper transparent insulation layer.

30. The method of claim 24, wherein forming the second structure comprises:

forming a second wire including a second contact and a second ancillary wire, the second contact being electrically connected to a contact region of the substrate, the second ancillary wire being positioned on the second contact to be electrically connected to the second contact; and forming an additional wire on the second wire, the additional wire including an additional contact and an additional ancillary wire, the additional contact being electrically connected to the second contact, the additional ancillary wire being positioned on the additional contact to be electrically connected to the additional contact.

31. The method of claim 30, wherein the second wire and the additional wire each include copper.

32. The method of claim 30, wherein the second wire and the additional wire are not positioned over the photodiode.

33. The method of claim 24, wherein forming the etch stop layer pattern and the capacitor upper electrode comprises:

forming a metal material layer on the dielectric layer; and patterning the metal material layer to simultaneously form the etch stop layer pattern and the capacitor upper electrode, the etch stop layer pattern being positioned over the photodiode, the capacitor upper electrode being positioned over the capacitor lower electrode.

34. The method of claim 33, wherein the metal material layer comprises any one material selected from the group consisting of titanium, tantalum, titanium nitride, and tantalum nitride.

35. The method of claim 24, wherein the opaque capping layer includes any one material selected from the group of silicon nitride or silicon carbide.

36. The method of claim 24, further comprising:

forming a protection structure on the first structure, the etch stop layer pattern and the second structure;

partially etching the protection structure to form a pad contact hole; and forming a pad including a conductive material in the pad contact hole.

* * * * *